(12) United States Patent
Tu et al.

(10) Patent No.: US 12,419,101 B2
(45) Date of Patent: Sep. 16, 2025

(54) INTEGRATED CIRCUIT DEVICE

(71) Applicant: TAIWAN SEMICONDUCTOR MANUFACTURING COMPANY, LTD., Hsinchu (TW)

(72) Inventors: Wen-Hsien Tu, New Taipei (TW); Dong-Jie Ke, Taichung (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 111 days.

(21) Appl. No.: 18/526,385

(22) Filed: Dec. 1, 2023

(65) Prior Publication Data

US 2024/0096710 A1   Mar. 21, 2024

Related U.S. Application Data

(62) Division of application No. 17/460,659, filed on Aug. 30, 2021, now Pat. No. 11,862,519.

(51) Int. Cl.
```
H10D 84/03     (2025.01)
H10D 62/13     (2025.01)
H10D 84/01     (2025.01)
H10D 84/85     (2025.01)
```
(52) U.S. Cl.
CPC ......... *H10D 84/038* (2025.01); *H10D 62/151* (2025.01); *H10D 84/017* (2025.01); *H10D 84/0193* (2025.01); *H10D 84/853* (2025.01)

(58) Field of Classification Search
None
See application file for complete search history.

(56) References Cited

U.S. PATENT DOCUMENTS

| | | |
|---|---|---|
| 10,269,932 B1 | 4/2019 | Arya et al. |
| 2017/0309624 A1 | 10/2017 | Cheng et al. |
| 2018/0151439 A1 | 5/2018 | Huang |
| 2018/0182756 A1 | 6/2018 | Lee et al. |
| 2018/0374759 A1 | 12/2018 | Holt et al. |
| 2019/0067445 A1 | 2/2019 | Ching et al. |
| 2019/0148528 A1* | 5/2019 | Yu ............ H10D 84/0193 257/288 |
| 2019/0157155 A1 | 5/2019 | Keng et al. |
| 2019/0304984 A1* | 10/2019 | Chang ............ H10D 30/62 |
| 2020/0135914 A1 | 4/2020 | Lin et al. |

\* cited by examiner

*Primary Examiner* — Cory W Eskridge
(74) *Attorney, Agent, or Firm* — Birch, Stewart, Kolasch & Birch, LLP

(57) ABSTRACT

An integrated circuit device is provided. The integrated circuit device includes a semiconductor substrate, first and second semiconductor fins over the semiconductor substrate, and first and second epitaxy structures respectively on the first and second semiconductor fins. The first epitaxy structure is merged with the second epitaxy structure, and a bottom surface of the second epitaxy structure is lower than a bottom surface of the first epitaxy structure.

20 Claims, 43 Drawing Sheets

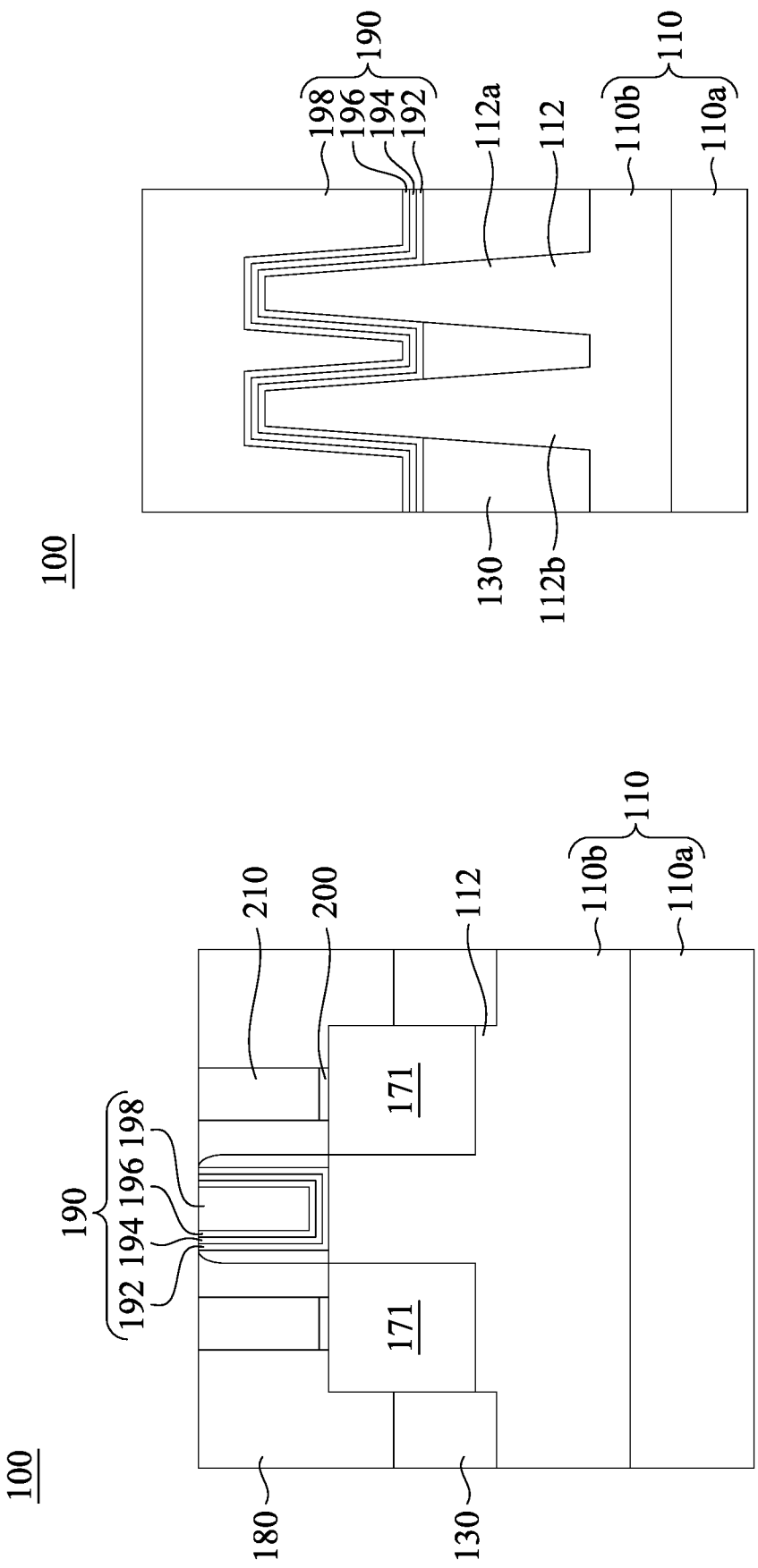

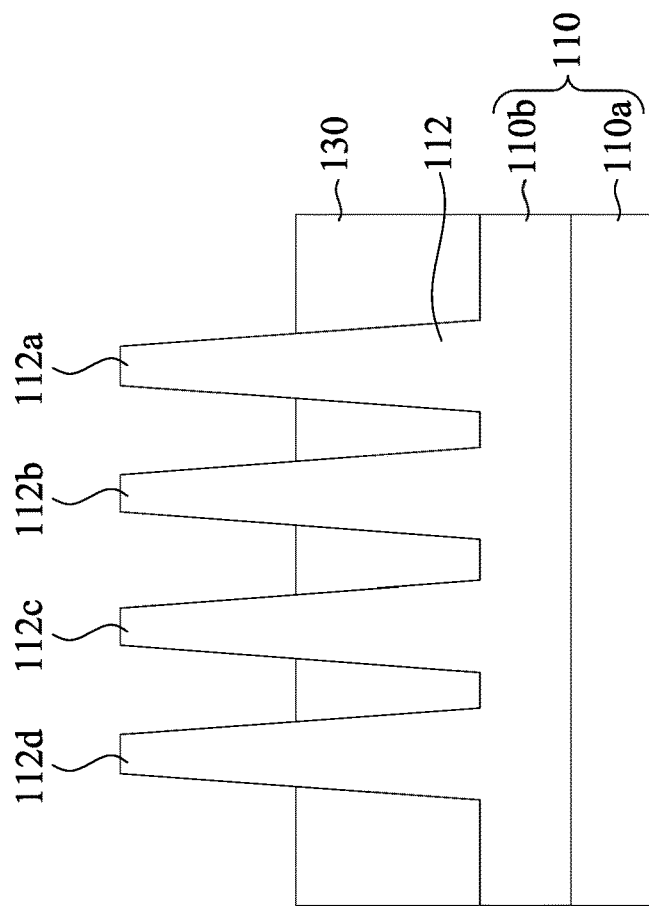
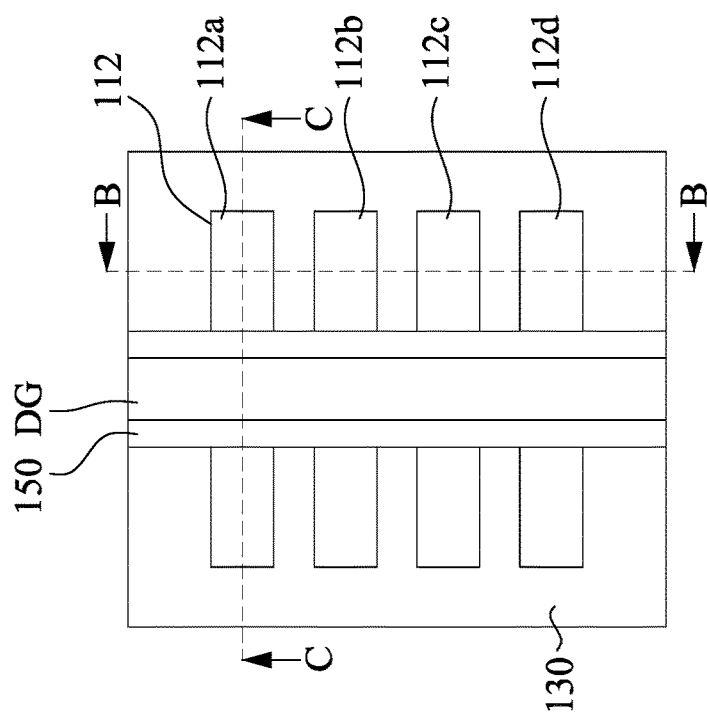
Fig. 15A
Fig. 15B

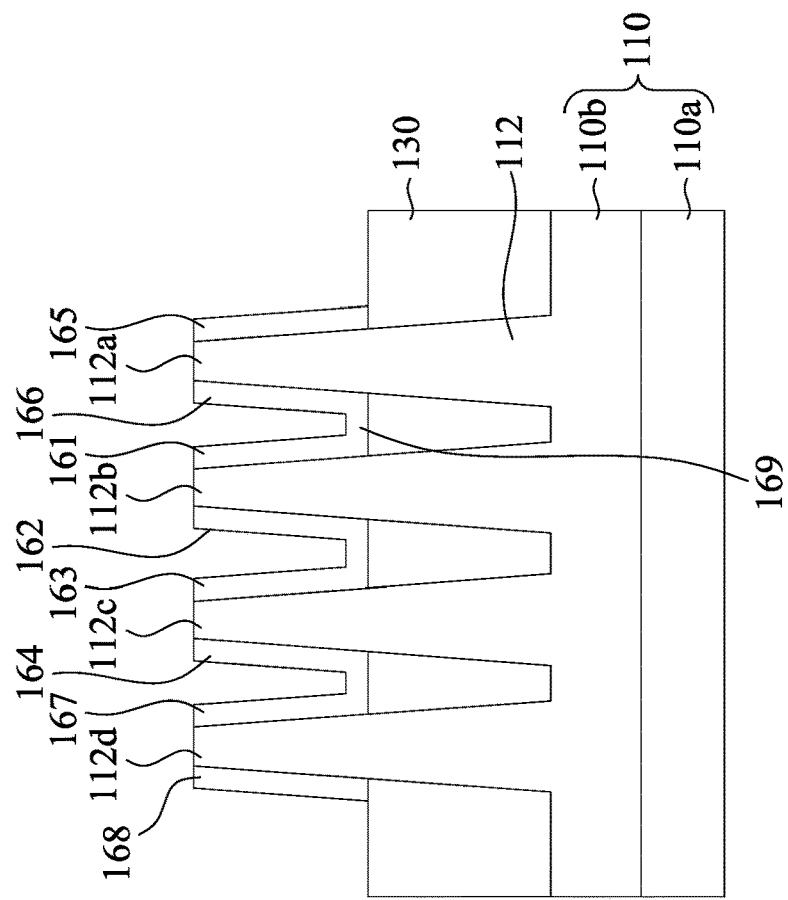
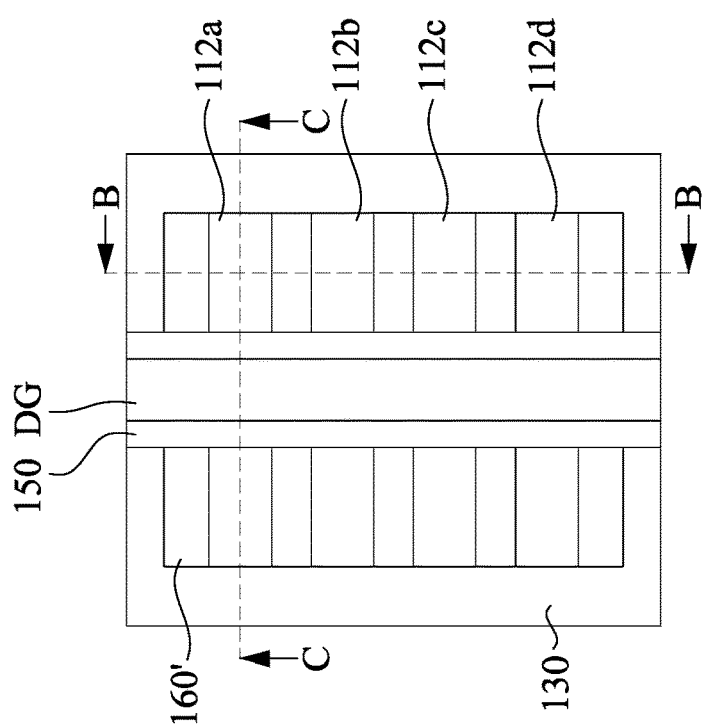
Fig. 23B
Fig. 23A

US 12,419,101 B2

INTEGRATED CIRCUIT DEVICE

PRIORITY CLAIM AND CROSS-REFERENCE

This application is a divisional application of U.S. patent application Ser. No. 17/460,659, filed Aug. 30, 2021, the entirety of which is incorporated by reference herein in its entirety.

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A FinFET includes an extended semiconductor fin that is elevated above a substrate in a direction normal to the plane of the substrate. The channel of the FET is formed in this vertical fin. A gate is provided over (e.g., wrapping) the fin. The FinFETs further can reduce the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
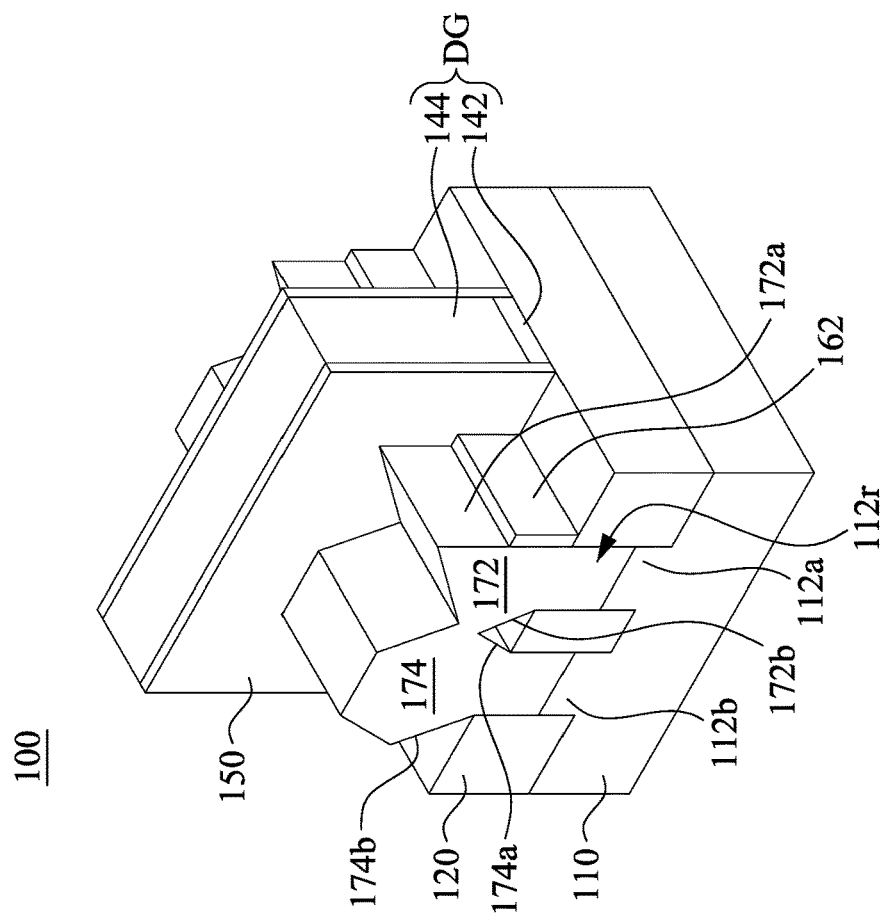
FIG. 2 is a cross-sectional view of an integrated circuit device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, an integrated circuit device having a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1:
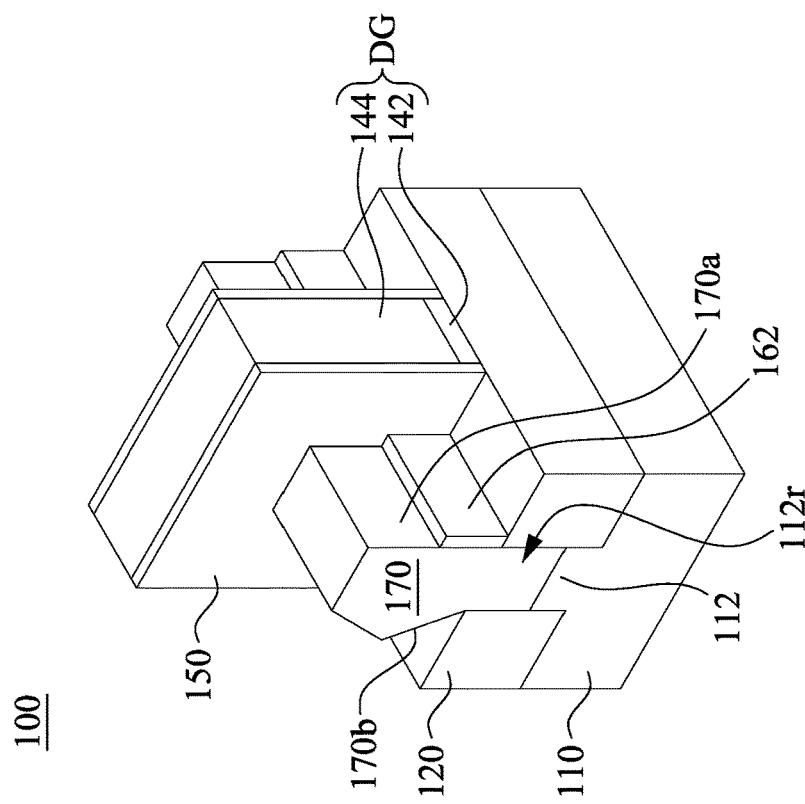
FIG. 1 is a cross-sectional view of an integrated circuit device according to some embodiments of the present disclosure.

FIG. 1 is a cross-sectional view of an integrated circuit device 100 according to some embodiments of the present disclosure. The integrated circuit device 100 includes a semiconductor substrate 110, isolation dielectrics 120, a gate structure DG, gate spacers 150, a fin sidewall spacer 162, and an epitaxial feature 170. The isolation dielectrics 120 is over the substrate 110 and surrounds a semiconductor fin 112 of the semiconductor substrate 110. The gate structure DG is crossing a first portion of the fin 112 protruding from a top surface of the isolation dielectrics 120. The gate structure DG may include a gate dielectric layer 142 and a gate electrode layer 144. The gate spacers 150 are respectively on opposite sides of the gate structure DG. A second portion of the fin 112 not covered by the gate structure DG may be recessed to form a recess 112r. The epitaxial feature 170 may be formed over the recessed second portion of the fin 112 and filling the recess 112r. In some embodiments of the present disclosure, the fin sidewall spacer 162 is at a first side 170a of the epitaxial feature 170, and a second side 170b of the epitaxial feature 170 may be free of a fin sidewall spacer. Through the configuration of the fin sidewall spacer 162, the epitaxial growth of the epitaxial feature 170 on the second portion of the fin 112 may be limited by the fin sidewall spacer 162. For example, the epitaxial feature 170 extends further to the second side 170b than to the first side 170a.

FIG. 2 is a cross-sectional view of an integrated circuit device 100 according to some embodiments of the present disclosure. The present embodiments are similar to those shown in FIG. 1, and one of the differences between the present embodiments and the embodiments of FIG. 1 is that: epitaxial features 172 and 174 are respectively on semiconductor fins 112a and 112b of the semiconductor substrate 110, and the fin sidewall spacer 162 is at a first side 172a of the epitaxial feature 172. In some embodiments of the present disclosure, a second side 172b of the epitaxial feature 172 and two opposite sides 174a and 174b of the epitaxial feature 174 are free of a fin sidewall spacer. Through the configuration of the fin sidewall spacer 162, the epitaxial feature 172 extends further to the epitaxial feature 174, thereby merging with the epitaxial feature 174. Other details are similar to those illustrated with the embodiments of FIG. 1, and therefore not repeated herein.

Figure 3:
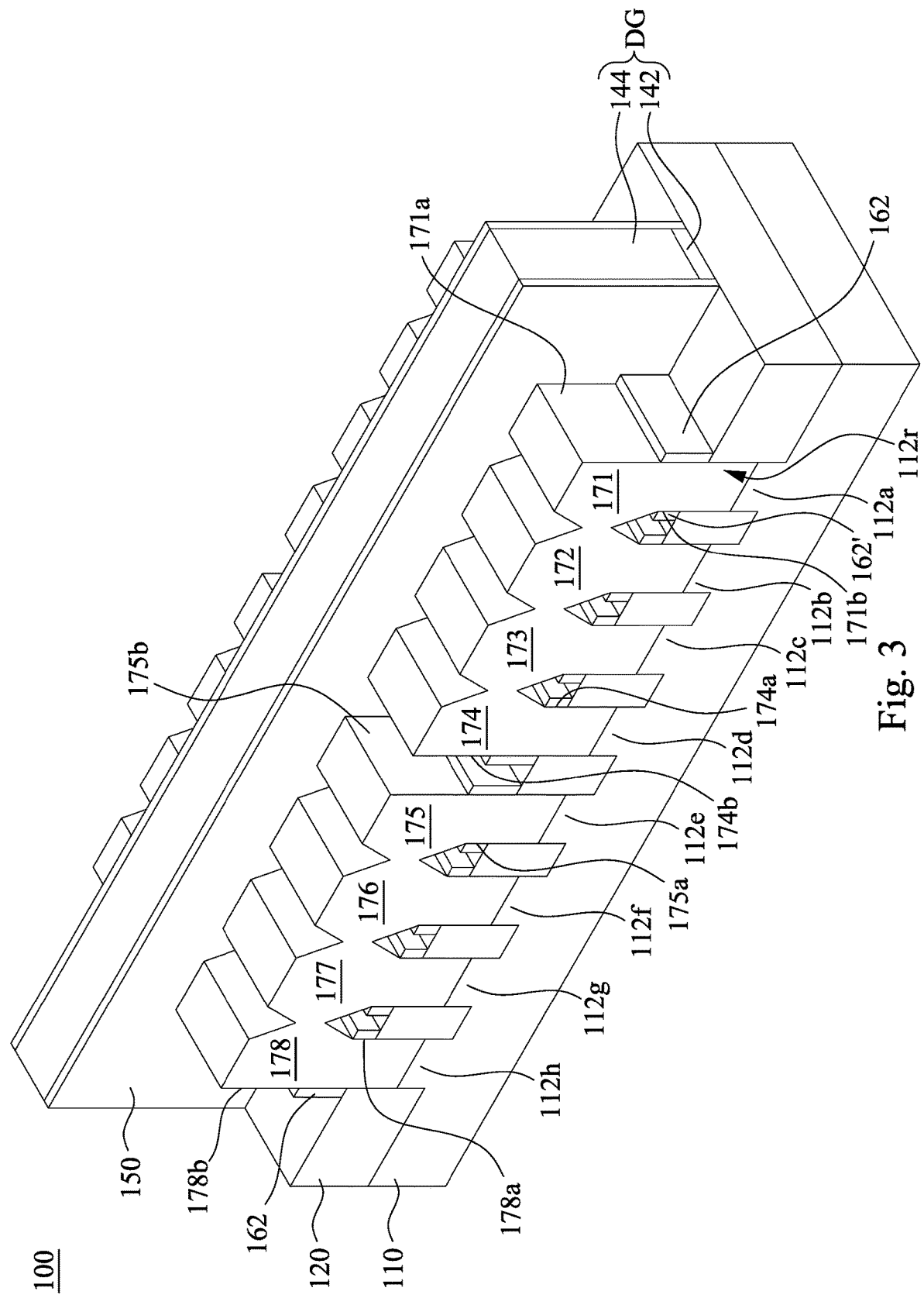
FIG. 3 is a cross-sectional view of an integrated circuit device according to some embodiments of the present disclosure.

FIG. 3 is a cross-sectional view of an integrated circuit device 100 according to some embodiments of the present disclosure. The present embodiments are similar to those shown in FIG. 2, and one of the differences between the present embodiments and the embodiments of FIG. 2 is that: epitaxial features 171-178 are respectively on semiconductor fins 112a-112h of the semiconductor substrate 110, and the fin sidewall spacers 162 are respectively at a first side 171a of the epitaxial feature 171, a second side 174b of the epitaxial feature 174, a first side 175a of the epitaxial feature 175, and a second side 178b of the epitaxial feature 178. Through the configuration of the fin sidewall spacers 162, the epitaxial features 171-174 are merged, the epitaxial features 175-178 are merged, and the merged epitaxial features 171-174 are spaced apart from the merged epitaxial features 175-178.

In some embodiments of the present disclosure, the integrated circuit device 100 further includes fin sidewall spacers 162' on opposite sides of the epitaxial features 172, 173, 176, and 177, and on a second side 171b of the epitaxial feature 171, a first side 174a of the epitaxial feature 174, a second side 175b of the epitaxial feature 175, and a first side 178a of the epitaxial feature 178. In some embodiments, a height of the fin sidewall spacers 162' is less than a height of the fin sidewall spacers 162, such that the fin sidewall spacers 162' have less influence on the epitaxial growth of the epitaxial features 171-178, which in turn result in that the epitaxial features 171-174 are merged, and the epitaxial features 175-178 are merged. In some other embodiments, the fin sidewall spacers 162' may be omitted.

Figure 4:
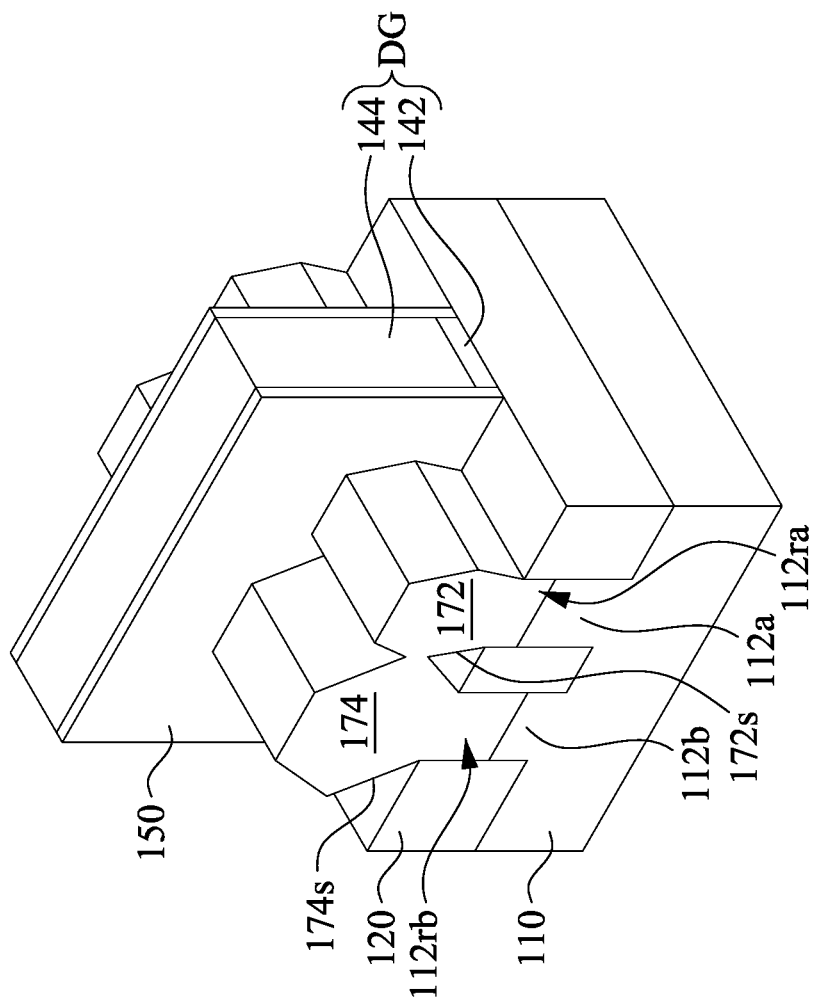
FIG. 4 is a cross-sectional view of an integrated circuit device according to some embodiments of the present disclosure.

FIG. 4 is a cross-sectional view of an integrated circuit device 100 according to some embodiments of the present disclosure. The present embodiments are similar to those shown in FIG. 2, and one of the differences between the present embodiments and the embodiments of FIG. 2 is that: a recess 112rb over the semiconductor fin 112b is deeper than a recess 112ra over the semiconductor fin 112a. By designing the recesses 112ra and 112rb have different depths, the semiconductor material may be epitaxially deposited over the semiconductor fins 112a and 112b with different facets. For example, the epitaxial feature 174 has a sidewall surface 174s with (111) facet, which tilts substantially 45 degrees with respect to a top surface of the substrate 110. The epitaxial feature 172 over the semiconductor fin 112a may have a sidewall surface 172s at an angle greater than 45 degrees with respect to the top surface of the substrate 110. That is, the sidewall surface 172s of the epitaxial feature 172 may be more vertical than a sidewall surface 174s of the epitaxial feature 174 is. Through the configuration, the epitaxial feature 172 extends laterally less than the epitaxial feature 174 does, and the epitaxial feature 174 over the semiconductor fin 112b has a greater size than the epitaxial feature 172 over the semiconductor fin 112a. In some embodiments, a height of the epitaxial feature 174 may be greater than a height of the epitaxial feature 172. In some embodiments, a top surface of the epitaxial feature 174 may be higher than a top surface of the epitaxial feature 172. The depths of the recesses 112ar and 112br are tuned such that the epitaxial features 172 and 174 are merged. In the present embodiments, the fin sidewall spacers 162 and 162' (referring to FIGS. 1-3) may be omitted. Alternatively, in some embodiments, fin sidewall spacers 162 and/or 162' (referring to FIGS. 1-3) may be formed on sidewalls of the epitaxial features 172 and 174.

Figure 5:
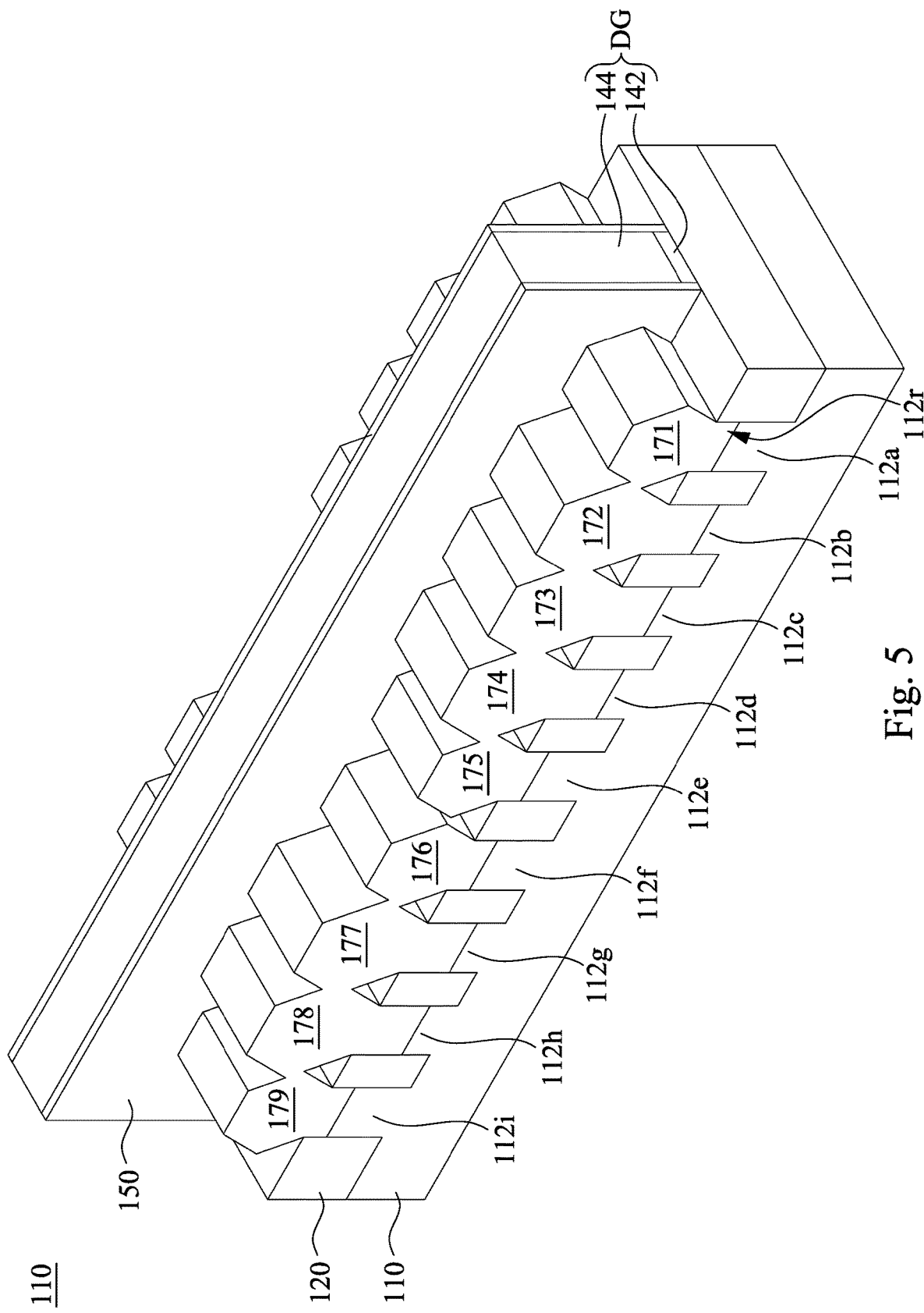
FIG. 5 is a cross-sectional view of an integrated circuit device according to some embodiments of the present disclosure.

FIG. 5 is a cross-sectional view of an integrated circuit device 100 according to some embodiments of the present disclosure. The present embodiments are similar to those shown in FIG. 4, and one of the differences between the present embodiments and the embodiments of FIG. 4 is that: epitaxial features 171-179 are respectively on semiconductor fins 112a-112i of the semiconductor substrate 110, and recesses 112r, over the semiconductor fins 112b-112d, 112g, 112h are deeper than the recesses 112r over the semiconductor fins 112a, 112e, 112f, and 112i. Through the configuration, the epitaxial features 172-174, 177, and 178 have a greater size than the epitaxial features 171, 175, 176, and 179. In some embodiments, a height of the epitaxial features 172-174, 177, and 178 may be greater than a height of the epitaxial features 171, 175, 176, and 179. In some embodiments, a top surface of the epitaxial features 172-174, 177, and 178 may be higher than a top surface of the epitaxial features 171, 175, 176, and 179. The deepness of the recesses 112r are tuned such that the epitaxial features 171-175 are merged, the epitaxial features 176-179 are merged, and the merged epitaxial features 171-175 are spaced apart from the merged epitaxial features 176-179. Also, in the present embodiments, the fin sidewall spacers 162 and 162' (referring to FIGS. 1-3) may be omitted. Alternatively, in some embodiments, fin sidewall spacers 162 and/or 162' (referring to FIGS. 1-3) may be formed on sidewalls of the epitaxial features 171-179.

FIGS. 6A to 14D illustrate a method for manufacturing an integrated circuit device 100 at various stages in accordance with some embodiments of the present disclosure. The illustration is merely exemplary and is not intended to be limiting beyond what is specifically recited in the claims that follow. It is understood that additional operations may be provided before, during, and after the operations shown by FIGS. 6A to 14D, and some of the operations described below can be replaced or eliminated for additional embodiments of the method. The order of the operations/processes may be interchangeable.

Figure 6B:
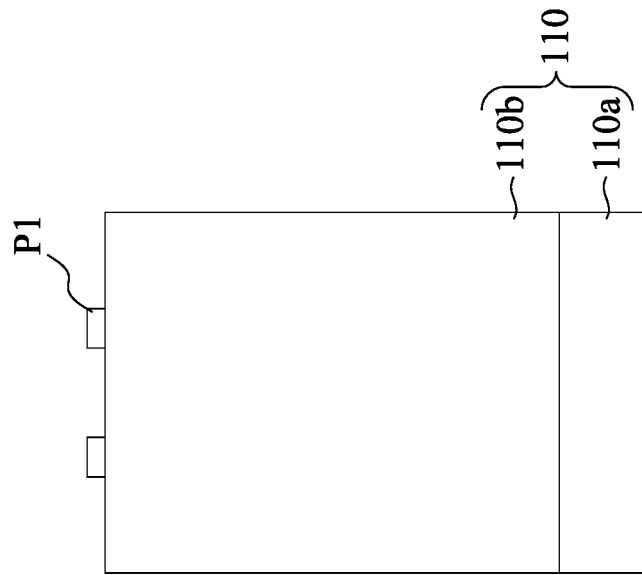
FIGS. 6A to 14D illustrate a method for manufacturing an integrated circuit device at various stages in accordance with some embodiments of the present disclosure.
Figure 6A:
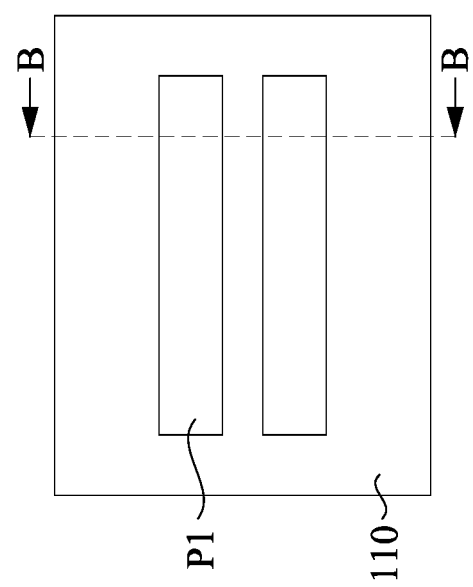

Reference is made to FIGS. 6A and 6B. FIG. 6A is a schematic top view of the integrated circuit device at an intermediate stage of the manufacturing method according to some embodiments of the present disclosure. FIG. 6B is a cross-sectional view taken along line B-B of FIG. 6A. A substrate 110 is illustrated. In some embodiments, the substrate 110 may be a semiconductor substrate, such as a bulk semiconductor, a semiconductor-on-insulator (SOI) substrate, or the like. The substrate 110 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. For example, the substrate 110 may include a wafer 110a, a semiconductor device layer 110b over the wafer 110a, and a BOX layer (not shown) between the wafer 110a and the semiconductor device layer 110b. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A patterned mask P1 is formed over the substrate 110. The patterned mask P1 may be a hard mask for protecting the underlying substrate 110 against subsequent etching process. The patterned mask P1 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes.

Figure 7B:
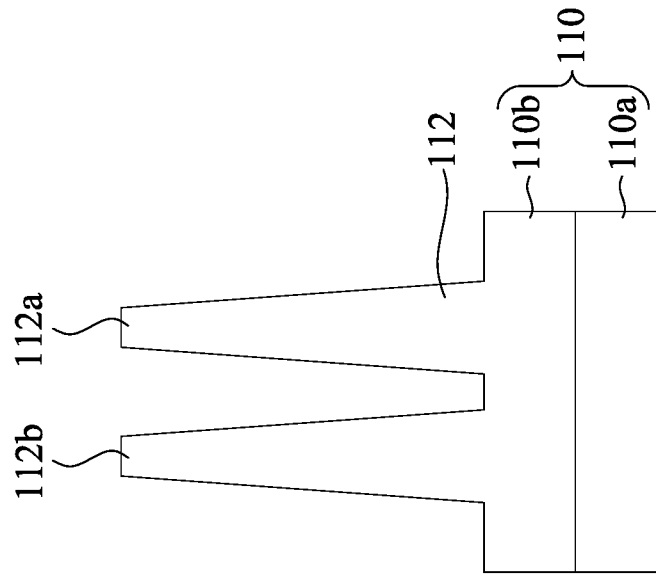
Figure 7A:
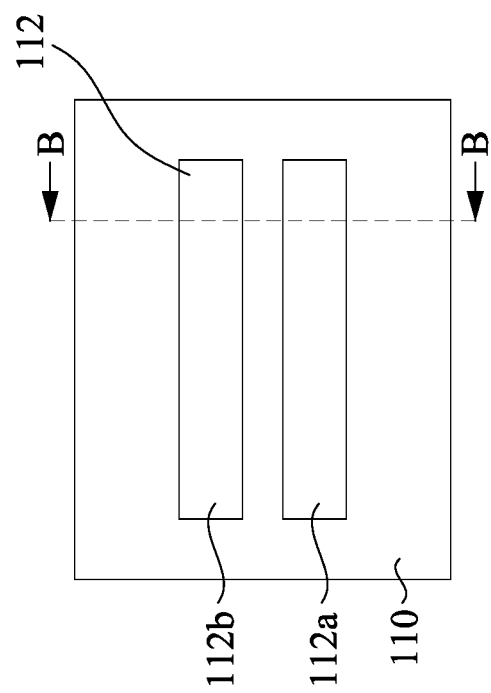

Reference is made to FIGS. 7A and 7B. FIG. 7A is a schematic top view of the integrated circuit device at an intermediate stage of the manufacturing method according to some embodiments of the present disclosure. FIG. 7B is a cross-sectional view taken along line B-B of FIG. 7A. In some embodiments, the substrate 110 is etched through the patterned mask P1 (referring to FIGS. 6A and 6B) to form the trenches T, and portions of the substrate 110 surrounded by the trenches T can be referred to as semiconductor fins 112. The etching processes may include dry etching, wet etching, and/or other etching methods (e.g., reactive ion etching). In some embodiments, plural semiconductor fins 112 are formed substantially parallel to each other. For better illustration, the semiconductor fins 112 are respectively labelled as semiconductor fins 112a-112b in the figure.

Figure 8B:
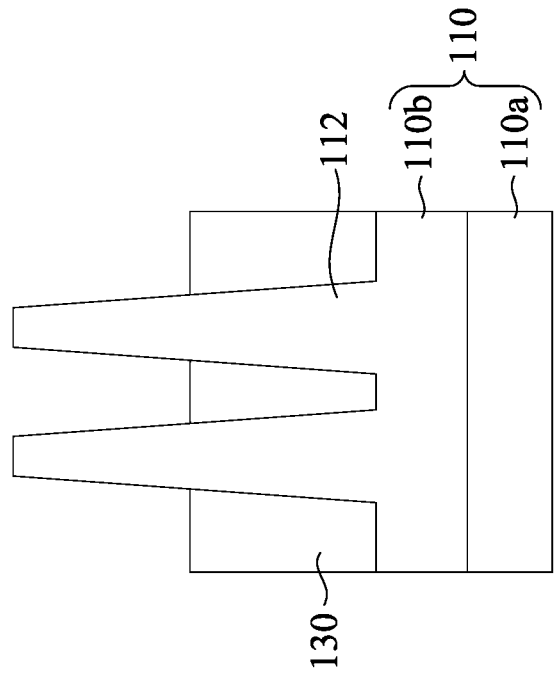
Figure 8A:
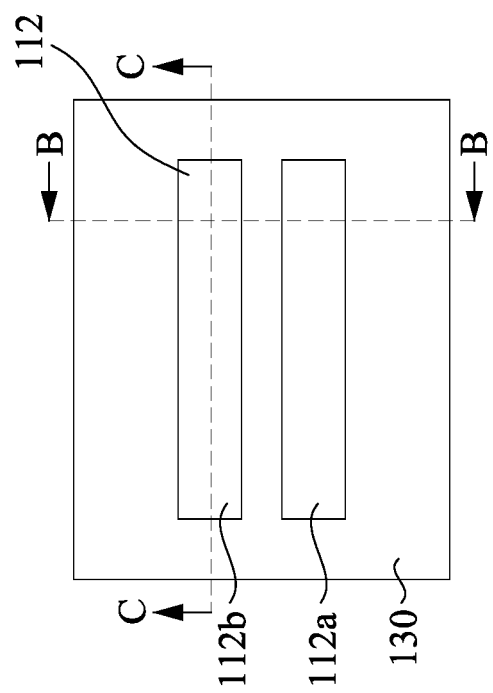
Figure 8C:
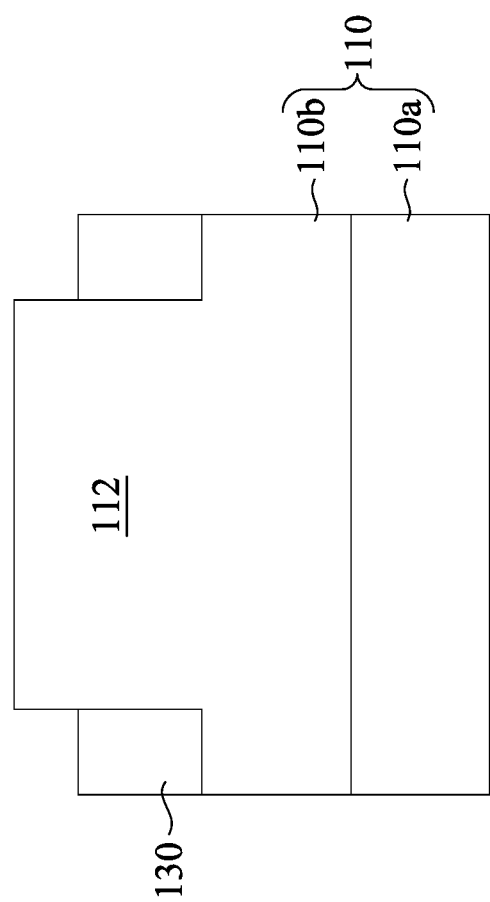

Reference is made to FIGS. 8A-8C. FIG. 8A is a schematic top view of the integrated circuit device at an intermediate stage of the manufacturing method according to some embodiments of the present disclosure. FIG. 8B is a cross-sectional view taken along line B-B of FIG. 8A. FIG. 8C is a cross-sectional view taken along line C-C of FIG. 8A. Shallow trench isolation (STI) features 130 are formed interposing the fins 112. In the present embodiments, a dielectric layer is deposited over the substrate 110 and filling the trenches T. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a sub-atmospheric CVD (SACVD) process, a flowable CVD process, an ALD process, a physical vapor deposition (PVD) process, and/or other suitable process. In some embodiments, the dielectric layer may include a multi-layer structure, for example, having one or more liner layers. After deposition of the dielectric layer, the deposited dielectric material is thinned and planarized, for example by a chemical mechanical polishing (CMP) process, thereby forming the STI features 130 between the fins 112. The STI features 130 may be recessed by suitable etching process, such as a dry etching process, a wet etching process, and/or a combination thereof. The recessing process provides the fins 112 extending above the STI features 130.

Figure 9B:
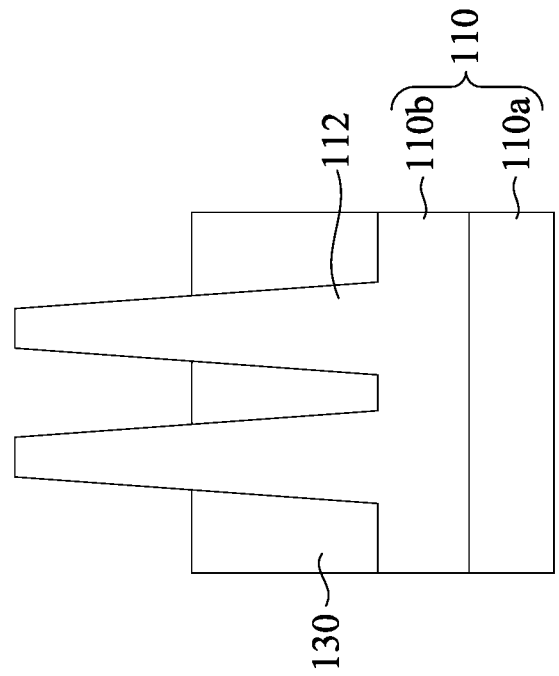
Figure 9A:
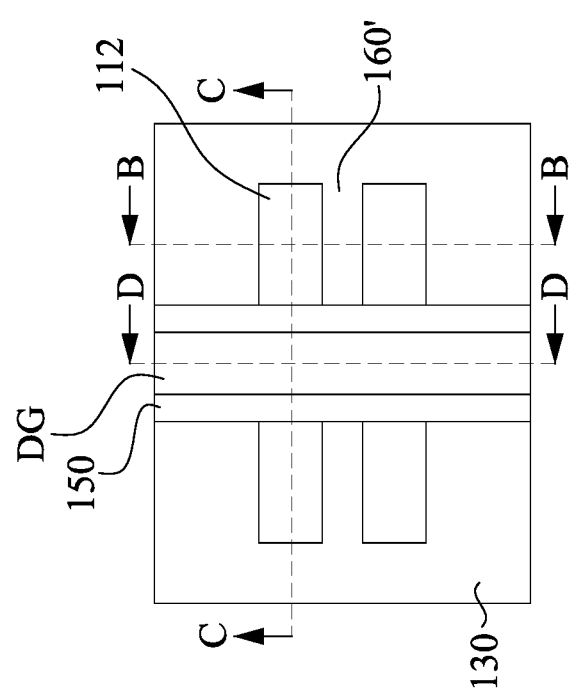
Figure 9D:
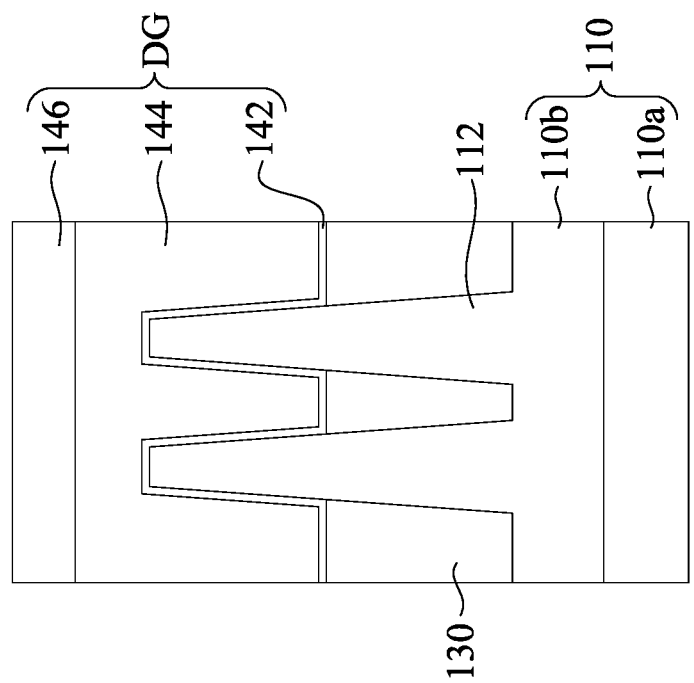
Figure 9C:
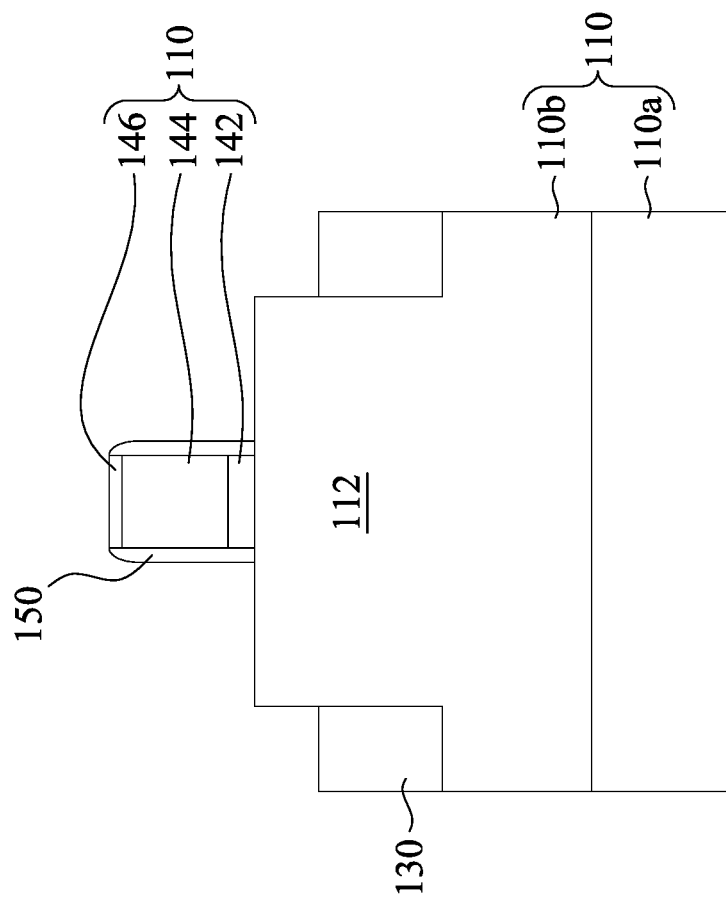

Reference is made to FIGS. 9A-9D. FIG. 9A is a schematic top view of the integrated circuit device at an intermediate stage of the manufacturing method according to some embodiments of the present disclosure. FIG. 9B is a cross-sectional view taken along line B-B of FIG. 9A. FIG. 9C is a cross-sectional view taken along line C-C of FIG. 9A. FIG. 9D is a cross-sectional view taken along line D-D of FIG. 9A. A gate structure DG is formed over a portion of the semiconductor fin 112. In some embodiments, the gate structure DG is dummy (sacrificial) gate structures that is subsequently removed. Thus, in some embodiments using a gate-last process, the gate structure DG is dummy gate structure and will be replaced by a final gate structure at a subsequent processing stage. In particular, the dummy gate structure DG may be replaced at a later processing stage by a high-k dielectric layer (HK) and metal gate electrode (MG) as discussed below. In some embodiments, the dummy gate structure DG is formed over the substrate 110 and is at least partially disposed over the fins 112. The portion of the fins 112 underlying the dummy gate structure DG may be referred to as the channel region. The dummy gate structure DG may also define a source/drain (S/D) region of the fins 112, for example, the regions of the fin 112 adjacent and on opposing sides of the channel region.

In some embodiments, the dummy gate structure DG is formed by various process steps such as layer deposition, patterning, etching, as well as other suitable processing steps. In the illustrated embodiments, the formation of the gate structure DG first includes depositing a dummy gate dielectric layer 142, a dummy gate electrode layer 144 and a hard mask layer 146 over the fins 112, and then patterning the layers 142-146 to form the dummy gate structure DG. In some embodiments, the dummy gate dielectric layer 142 may include SiO$_2$, silicon nitride, a high-k dielectric material and/or other suitable material. In various examples, the dummy gate dielectric layer 152 may be deposited by a CVD process, a sub-atmospheric CVD (SACVD) process, a flowable CVD process, an ALD process, a PVD process, or other suitable process. By way of example, the dummy gate dielectric layer 142 may be used to prevent damages to the fins 112 by subsequent processes (e.g., subsequent formation of the dummy gate structure). In some embodiments, the dummy gate electrode layer 144 may include polycrystalline silicon (polysilicon). In some embodiments, the hard mask layer 146 includes an oxide layer such as a pad oxide layer that may include SiO$_2$, and a nitride layer such as a pad nitride layer that may include Si$_3$N$_4$ and/or silicon oxynitride. Exemplary layer deposition processes include CVD (including both low-pressure CVD and plasma-enhanced CVD), PVD, ALD, thermal oxidation, e-beam evaporation, or other suitable deposition techniques, or combinations thereof.

In forming the gate structure for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, after patterning the dummy gate electrode layer 144, the dummy gate dielectric layer 142 is removed from the S/D regions of the fins 112. The etch process may include a wet etch, a dry etch, and/or a combination thereof. The etch process is chosen to selectively etch the dummy gate dielectric layer 142 without substantially etching the fins 112, the dummy gate electrode layer 144, and the hard mask 146.

In some embodiments, gate spacers 150 are then formed on opposite sidewalls of the dummy gate structure DG. In some embodiments, the gate spacers 150 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 150 may include a single layer or multilayer structure made of different dielectric materials. The method of forming the gate spacers 150 includes blanket forming a dielectric layer on top surface and sidewalls of the dummy gate structure DG using, for example, CVD, PVD or ALD, and then performing an etching process such as anisotropic etching to remove horizontal portions of the dielectric layer. The remaining portions of the dielectric layer on sidewalls of the dummy gate structure DG can serve as the gate spacers 150. In some embodiments, the gate spacers 150 may be used to offset subsequently formed doped regions, such as source/drain regions. The gate spacers 150 may further be used for designing or modifying the source/drain region profile.

Figure 10:
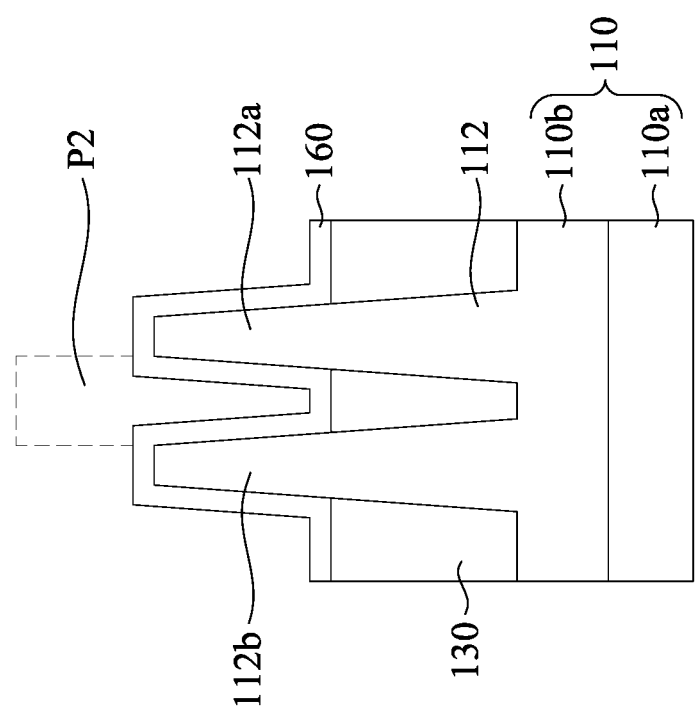

Reference is made to FIG. 10. FIG. 10 is a cross-sectional view of the integrated circuit device at an intermediate stage of the manufacturing method according to some embodiments of the present disclosure, and FIG. 10 is taken along the same cut as in FIG. 9B. A spacer material layer 160 is conformally deposited over the structure of FIGS. 9A-9D. For example, the spacer material layer 160 extends over top surfaces of the STI features 130, sidewalls of the fins 112a and 112b, and top surfaces of the fins 112a and 112b. The spacer material layer 160 may include a dielectric material such as silicon oxide, silicon nitride, silicon carbide, silicon oxynitride, SiCN films, silicon oxycarbide, SiOCN films, and/or combinations thereof. In some embodiments, the spacer material layer 160 may include multiple layers, such as main spacer walls, liner layers, and the like. By way of example, the spacer material layer 160 may be formed by depositing a dielectric material using processes such as, CVD process, a sub-atmospheric CVD (SACVD) process, a flowable CVD process, an ALD process, a PVD process, or other suitable process.

In some embodiments, a patterned mask P2 is formed over a portion of the spacer material layer 160. The patterned mask P2 may be a photoresist for protecting the spacer material layer 160 against subsequent etching process. The patterned mask P2 may be formed by photolithography patterning processes, including photoresist coating (e.g., spin-on coating), soft baking, mask aligning, exposure, post-exposure baking, developing the photoresist, rinsing, drying (e.g., hard baking), and/or other applicable processes. In some other embodiments, the patterned mask P2 may be a hard mask for protecting the spacer material layer 160 against subsequent etching process. The hard mask may include $Si_3N_4$ and/or silicon oxynitride.

Figure 11B:
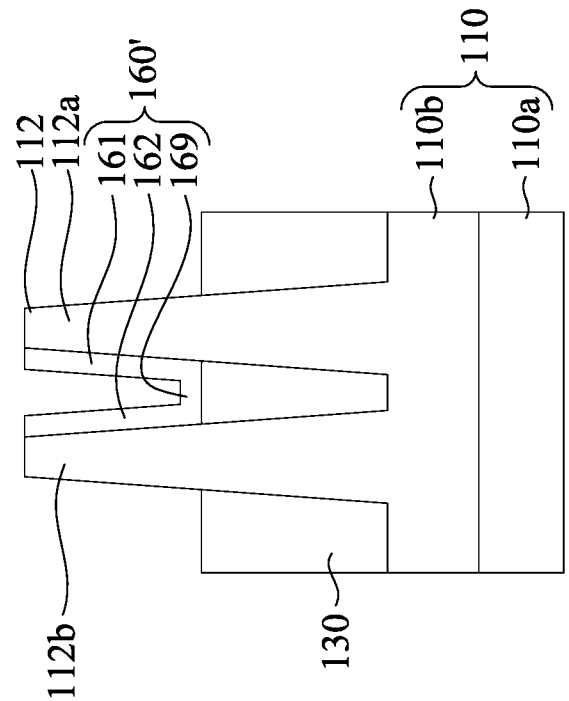
Figure 11A:
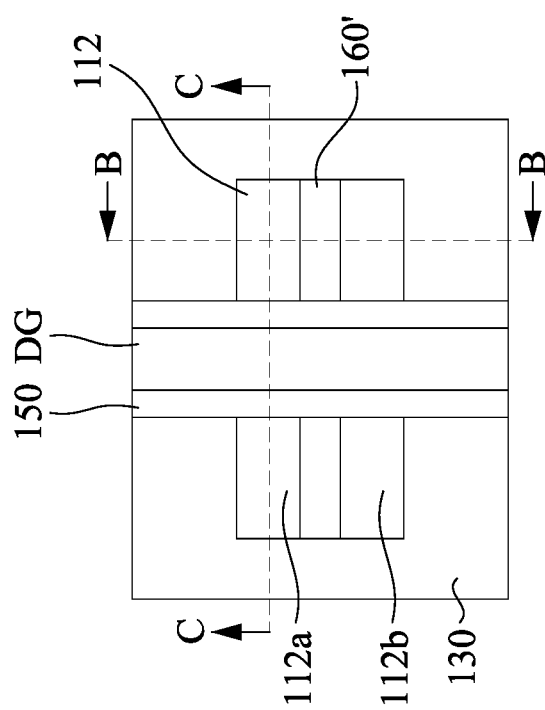
Figure 11C:
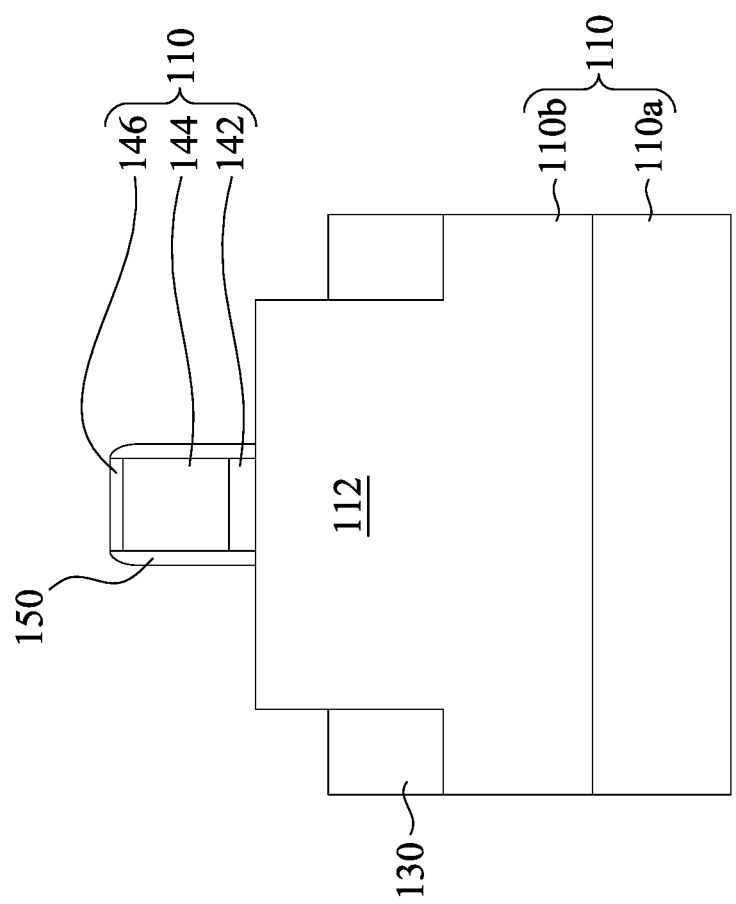

Reference is made to FIGS. 11A-11C. FIG. 11A is a schematic top view of the integrated circuit device at an intermediate stage of the manufacturing method according to some embodiments of the present disclosure. FIG. 11B is a cross-sectional view taken along line B-B of FIG. 11A. FIG. 11C is a cross-sectional view taken along line C-C of FIG. 11A. The spacer material layer 160 (referring to FIG. 10) is patterned to form a spacer 161 on a sidewall of the fin 112a facing the fin 112b, and a spacer 162 on a sidewall of the fin 112b facing the fin 112a, thereby exposing portions of the semiconductor fins 112a and 112b. In other words, the spacers 161-162 are between the semiconductor fins 112a and 112b. The patterning includes a suitable etching process. In some embodiments, the etching process includes a dry etching process using an etchant including a fluorine-containing gas, a chlorine-containing gas, other etching gas, or a combination thereof, such as $CF_4$, $SF_6$, $NF_3$, or $Cl_2$. By the etching process, portions of the spacer material layer 160 (referring to FIG. 10) exposed by the patterned mask P2 (referring to FIG. 10) is etched away, while a portion of the spacer material layer 160 covered by the patterned mask P2 (referring to FIG. 10) is protected from being etched. The remaining portion of the spacer material layer 160 (referring to FIG. 10) forms the spacers 161-162. In the present embodiments, the remaining portion of the spacer material layer 160 (referring to FIG. 10) further forms a portion 169 extending horizontally over the STI features 130 and connecting between the spacers 161 and 162. A combination of the spacers 161, 162, and the portion 169 may be referred to as spacer 160'. In some other embodiments, the patterned mask P2 (referring to FIG. 10) may be designed in another way such that the portion 169 is etched away, and the spacer 161 may be spaced apart from the spacer 162. After the patterning process, the patterned mask P2 (referring to FIG. 10) may be removed by suitable stripping process.

Figure 12B:
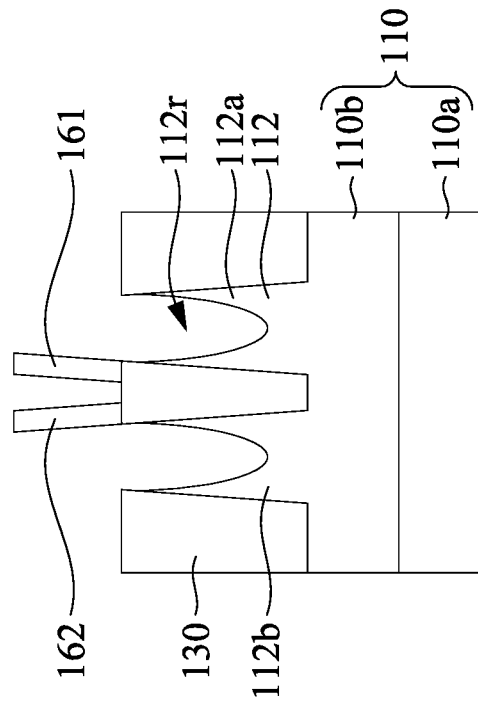
Figure 12A:
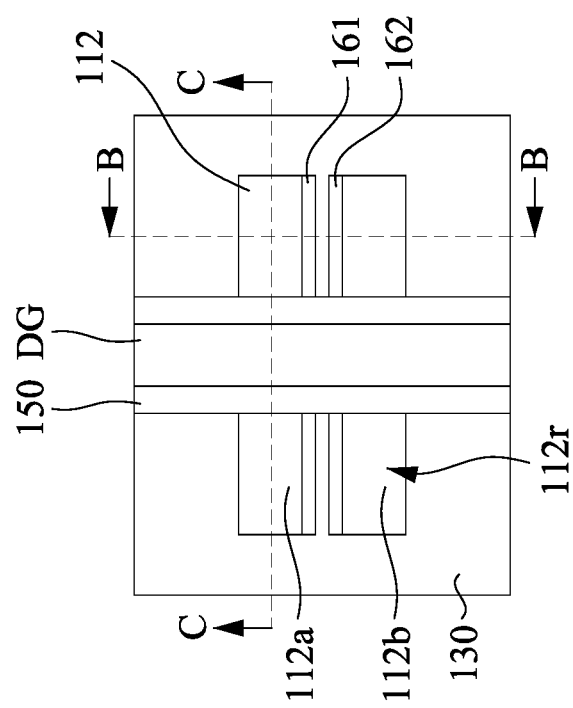
Figure 12C:
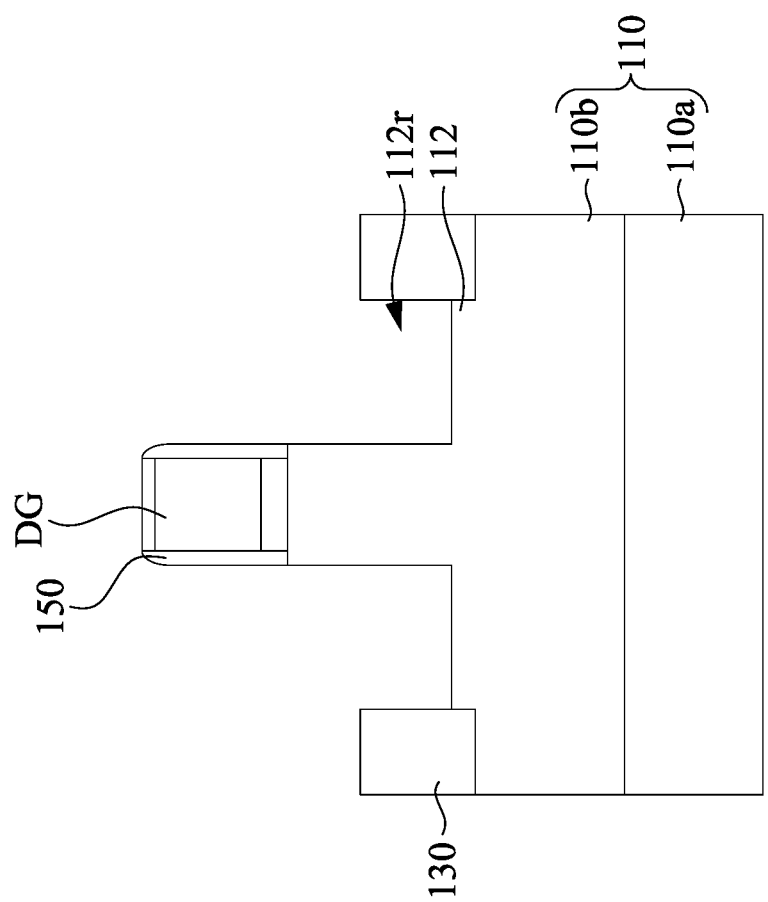

Reference is made to FIGS. 12A-12C. FIG. 12A is a schematic top view of the integrated circuit device at an intermediate stage of the manufacturing method according to some embodiments of the present disclosure. FIG. 12B is a cross-sectional view taken along line B-B of FIG. 12A. FIG. 12C is a cross-sectional view taken along line C-C of FIG. 12A. Exposed portions of the semiconductor fins 112 (e.g., the fins 112a and 112b) are recessed by suitable etching process by using the dummy gate structure DG, the gate spacers 150, and the STI features 130 as an etch mask, resulting in recesses 112r into the semiconductor fins 112. In some embodiments, the etching process may be a dry etching, a wet etch, or the combination thereof. In some embodiments, the etching process includes a dry etching process using an etchant including a halogen-containing compounds or the like. In some embodiments, the etching process may also consume the spacer 160' (referring to FIGS. 11A-11C). For example, in some embodiments, the portion 169 of the spacer 160' (referring to FIGS. 11A-11C) may be removed by the etching process, such that the spacer 161 and 162 are disconnected from each other. For example, in some embodiments, the etching process may also lower top surfaces of the spacers 161 and 162.

Figure 13B:
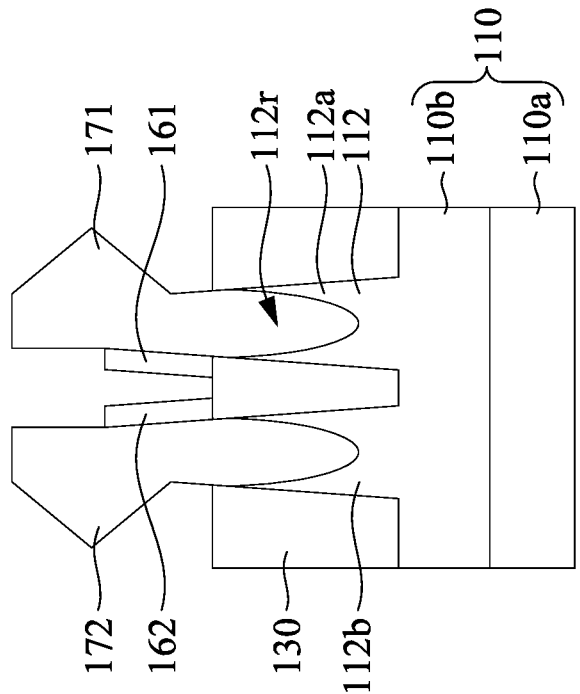
Figure 13A:
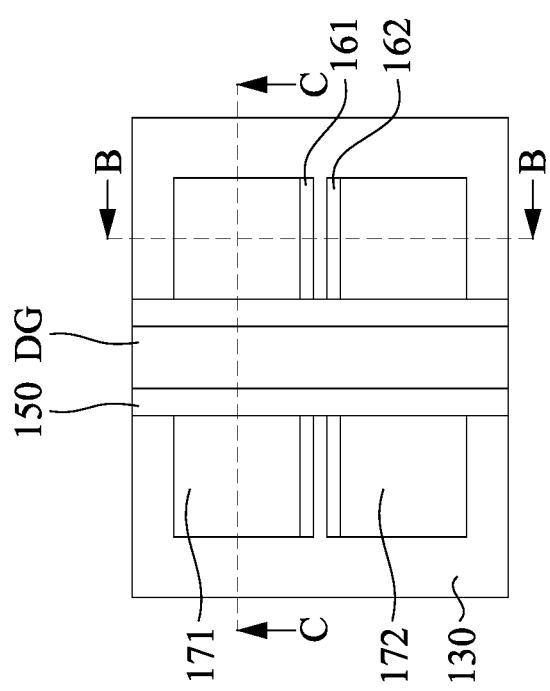
Figure 13C:
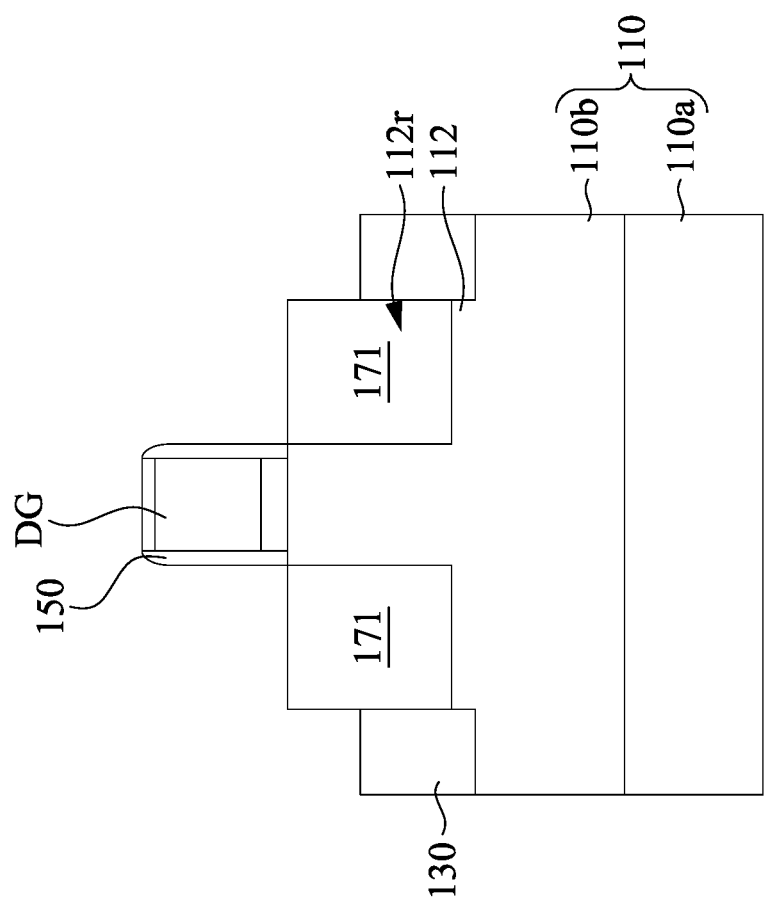

Reference is made to FIGS. 13A-13C. FIG. 13A is a schematic top view of the integrated circuit device at an intermediate stage of the manufacturing method according to some embodiments of the present disclosure. FIG. 13B is a cross-sectional view taken along line B-B of FIG. 13A. FIG. 13C is a cross-sectional view taken along line C-C of FIG. 13A. Epitaxial features 171 and 172 are respectively formed over the exposed portions of the semiconductor fins 112a and 112b. In some embodiments, the epitaxial features 171 and 172 may include Ge, Si, GaAs, AlGaAs, SiGe, GaAsP, SiP, or other suitable material. The epitaxial features 171 and 172 may be in-situ doped during the epitaxial process by introducing doping species including: p-type dopants, such as boron or $BF_2$; n-type dopants, such as phosphorus or arsenic; and/or other suitable dopants including combinations thereof. If the epitaxial features 171 and 172 are not in-situ doped, an implantation process (i.e., a junction implant process) is performed to dope the epitaxial features 171 and 172.

The epitaxial features 171 and 172 may be formed by performing an epitaxial growth process that provides an epitaxial material on the fins 112. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the fins 112.

In some further embodiments, the epitaxial growths of the epitaxial features 171 and 172 are respectively confined by the fin sidewall spacers 161 and 162, thereby preventing the epitaxial features 171 and 172 from merging with each other. After the epitaxial growths of the epitaxial features 171 and 172, the fin sidewall spacers 161 and 162 are respectively formed on a side of the epitaxial feature 171 and a side of the epitaxial feature 172 facing each other.

Figure 14B:
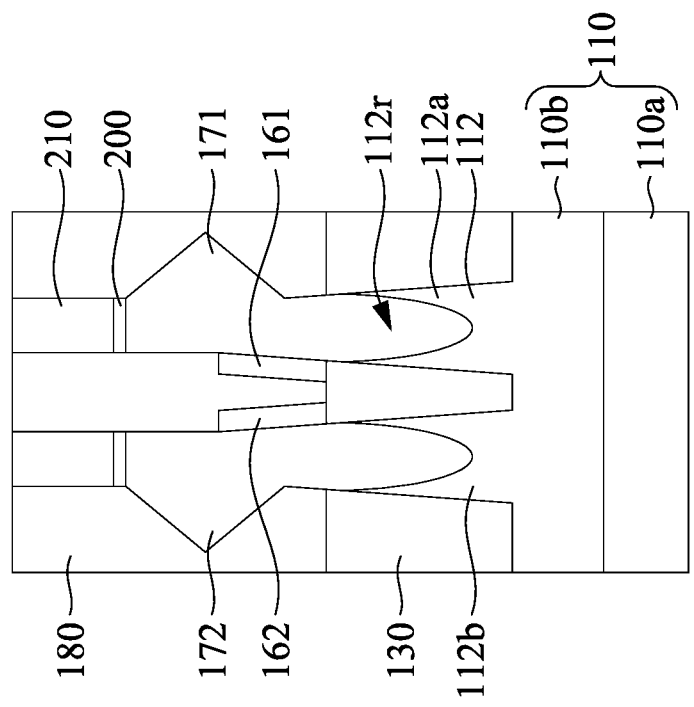
Figure 14A:
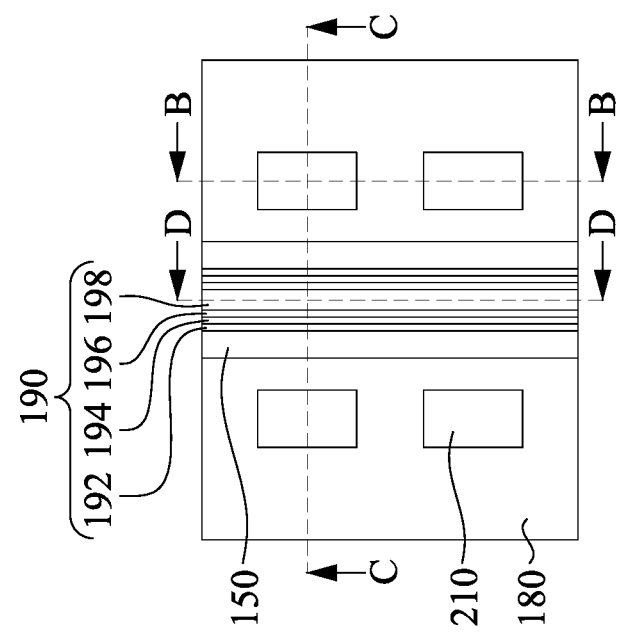

Reference is made to FIGS. 14A-14C. FIG. 14A is a schematic top view of the integrated circuit device 100 according to some embodiments of the present disclosure. FIG. 14B is a cross-sectional view taken along line B-B of FIG. 14A. FIG. 14C is a cross-sectional view taken along line C-C of FIG. 14A. FIG. 14D is a cross-sectional view taken along line C-C of FIG. 14D. An ILD layer 180 is formed on the substrate 110. In some embodiments, the ILD layer 180 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG). The ILD layer 180 may be deposited by a PECVD process or other suitable deposition technique. In some embodiments, a contact etch stop layer (CESL) is also formed prior to forming the ILD layer 180. In some examples, the CESL includes a silicon nitride layer, silicon oxide layer, a silicon oxynitride layer, and/or other suitable materials having a different etch selectivity than the ILD layer 180. In some embodiments, after formation of the ILD layer 180, the integrated circuit device 100 may be subject to a high thermal budget process to anneal the ILD layer 180.

In some examples, after depositing the ILD layer 180, a planarization process may be performed to remove excessive materials of the ILD layer 180. For example, a planarization process includes a chemical mechanical planarization (CMP) process which removes portions of the ILD layer 180 (and CESL layer, if present) overlying the dummy gate structures DG and planarizes a top surface of the integrated circuit device 100. In some embodiments, the CMP process also removes hard mask layers 136 (as shown in FIGS. 13B-13C) and exposes the dummy gate electrode layer 144.

Subsequently, the dummy gate structure DG is replaced with the metal gate structure 190. For example, the dummy gate structure DG is removed by a selective etching process (e.g., selective dry etching, selective wet etching, or a combination thereof) that etches the materials in dummy gate structures DG at a faster etch rate than it etches other materials (e.g., gate spacers 150, CESL and/or ILD layer 180), thus resulting in a gate trench GT between corresponding gate spacers 150. Then, a metal gate structure 190 is formed in the gate trench GT. The metal gate structure 190 may be a high-k/metal gate stack, however other compositions are possible. In various embodiments, the metal gate structure 190 includes an interfacial layer 192, a high-k dielectric layer 194, a work function metal layer 196, and a fill metal 198 filling a remainder of gate trenches GT. Formation of the high-k/metal gate structures 430 may include depositions to form various gate materials, one or more liner layers, and one or more CMP processes to remove excessive gate materials.

In some embodiments, the interfacial layer 192 may include a dielectric material such as silicon oxide ($SiO_2$), HfSiO, or silicon oxynitride (SiON). The interfacial layer 192 may be formed by chemical oxidation, thermal oxidation, atomic layer deposition (ALD), chemical vapor deposition (CVD), and/or other suitable method. The high-k dielectric layer 194 may include hafnium oxide ($HfO_2$). Alternatively, the high-k dielectric layer 194 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 196 may include work function metals to provide a suitable work function for the high-k/metal gate structures 190. For an n-type GAA FET, the work function metal layer 196 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the work function metal layer 196 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 198 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

In some embodiments, contacts 210 are formed in the ILD layer 180 and over the epitaxial features 171 and 172. In some embodiments, contact openings are first formed through the ILD layer 180 to expose the epitaxial features 171 and 172 by using suitable photolithography and etching techniques. Subsequently, silicide regions 200 are formed on the front side of the epitaxial features 171 and 172 by using a silicidation process, followed by forming contacts 210 over the silicide regions 200. Silicidation may be formed by depositing a metal layer (e.g., nickel layer or cobalt layer) over the exposed epitaxial features 171 and 172, annealing the metal layer such that the metal layer reacts with silicon (and germanium if present) in the epitaxial features 171 and 172 to form the metal silicide region 200 (e.g., nickel silicide or cobalt silicide), and thereafter removing the non-reacted metal layer. The contact 210 may be formed by depositing one or more metal materials (e.g., tungsten, cobalt, copper, the like or combinations thereof) to fill the contact holes by using suitable deposition techniques (e.g., CVD, PVD, ALD, the like or combinations thereof), followed by a CMP process to remove excess metal materials outside the contact openings.

FIGS. 15A to 20D illustrate a method for manufacturing an integrated circuit device 100 at various stages in accordance with some embodiments of the present disclosure. It is understood that additional operations may be provided before, during, and after the operations shown by FIGS. 15A to 20D, and some of the operations described below can be replaced or eliminated for additional embodiments of the method. The order of the operations/processes may be interchangeable.

Figure 15C:
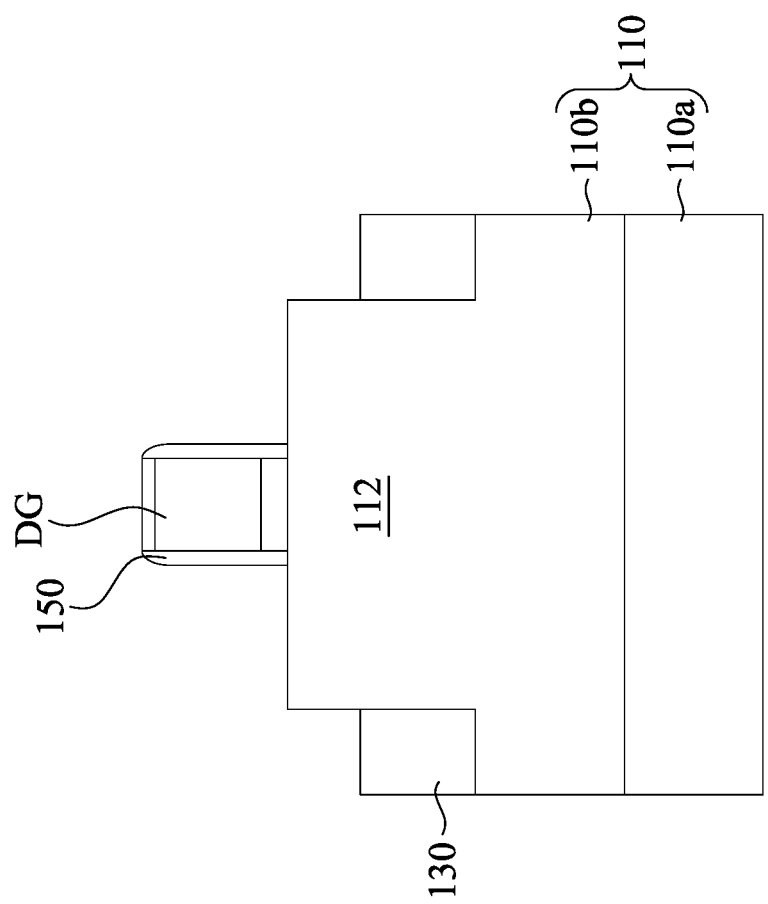
FIGS. 15A to 20D illustrate a method for manufacturing an integrated circuit device at various stages in accordance with some embodiments of the present disclosure.

Reference is made to FIGS. 15A-15C. FIG. 15A is a schematic top view of the integrated circuit device at an intermediate stage of the manufacturing method according to some embodiments of the present disclosure. FIG. 15B is a cross-sectional view taken along line B-B of FIG. 15A. FIG. 15C is a cross-sectional view taken along line C-C of FIG. 15A. STI features 130 are formed interposing the fins 112, and the fins 112 extend above the STI features 130. Dummy gate structure DG are formed over portions of the fins 112. For better illustration, the semiconductor fins 112 are respectively labelled as semiconductor fins 112a-112d in the present embodiments. In some embodiments, the semiconductor fins 112a-112d are equidistantly arranged. For example, a distance between the fins 112a and 112b is substantially equal to a distance between the semiconductor fins 112b and 112c and a distance between the semiconductor fins 112c and 112d. Other details for forming the structure of FIGS. 15A-15C are similar to those aforementioned in FIGS. 6A-9D, and therefore not repeated herein.

Figure 16:
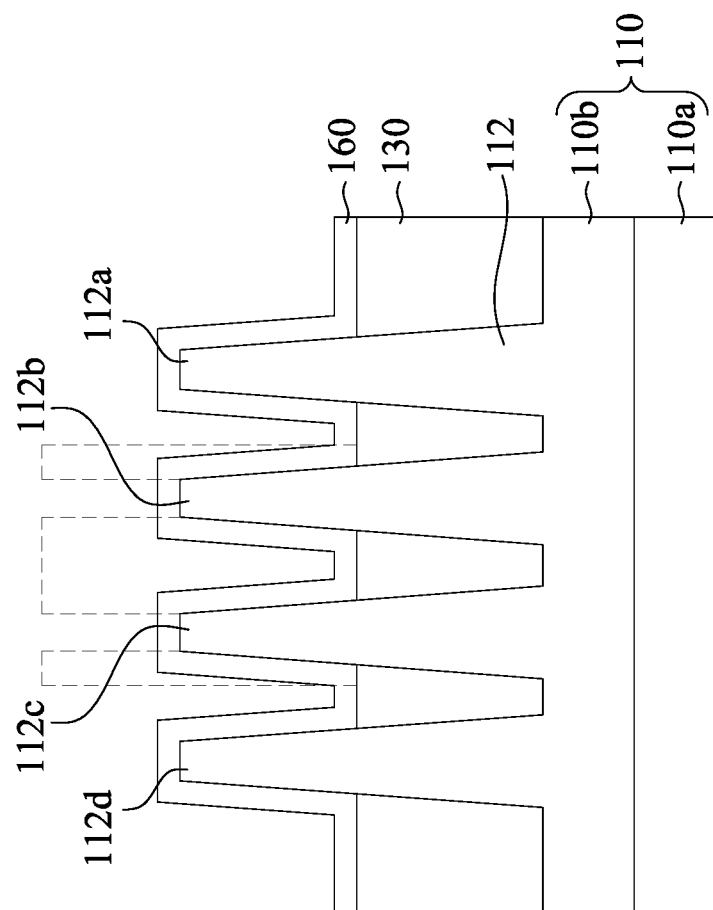

Reference is made to FIG. 16. FIG. 16 is a cross-sectional view of the integrated circuit device at an intermediate stage of the manufacturing method according to some embodiments of the present disclosure, and FIG. 16 is taken along the same cut as in FIG. 15B. A spacer material layer 160 is conformally deposited over the structure of FIGS. 15A-15C. For example, the spacer material layer 160 extends over top surfaces of the STI features 130, sidewalls of the fins 112a-112d, and top surfaces of the fins 112a-112d. The spacer material layer 160 may include a dielectric material such as silicon oxide, silicon nitride, silicon carbide, silicon oxynitride, SiCN films, silicon oxycarbide, SiOCN films, and/or combinations thereof. By way of example, the spacer material layer 160 may be formed by depositing a dielectric material using processes such as, CVD process, a subatmospheric CVD (SACVD) process, a flowable CVD process, an ALD process, a PVD process, or other suitable process.

In some embodiments, a patterned mask P2' is formed over a portion of the spacer material layer 160 over the fins 112b and 112c, and another portion of the spacer material layer 160 over the fins 112a and 112d may be free of coverage of the patterned mask P2'. The patterned mask P2' may be a photoresist for protecting the spacer material layer 160 against subsequent etching process. The patterned mask P2' may be formed by photolithography patterning processes, including photoresist coating (e.g., spin-on coating), soft baking, mask aligning, exposure, post-exposure baking, developing the photoresist, rinsing, drying (e.g., hard baking), and/or other applicable processes. In some other embodiments, the patterned mask P2' may be a hard mask for protecting the spacer material layer 160 against subsequent etching process.

Figure 17B:
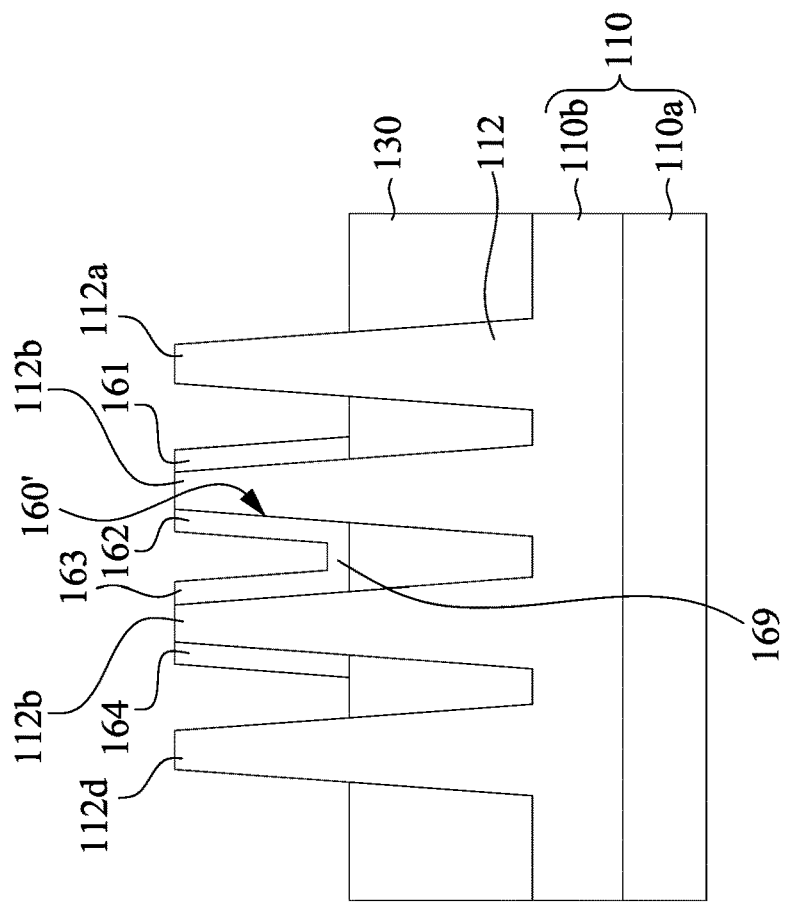
Figure 17A:
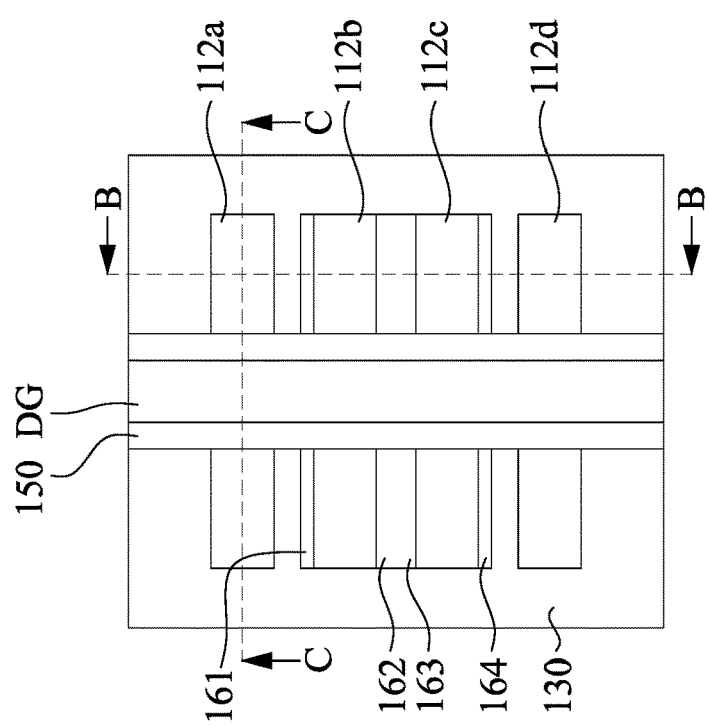
Figure 17C:
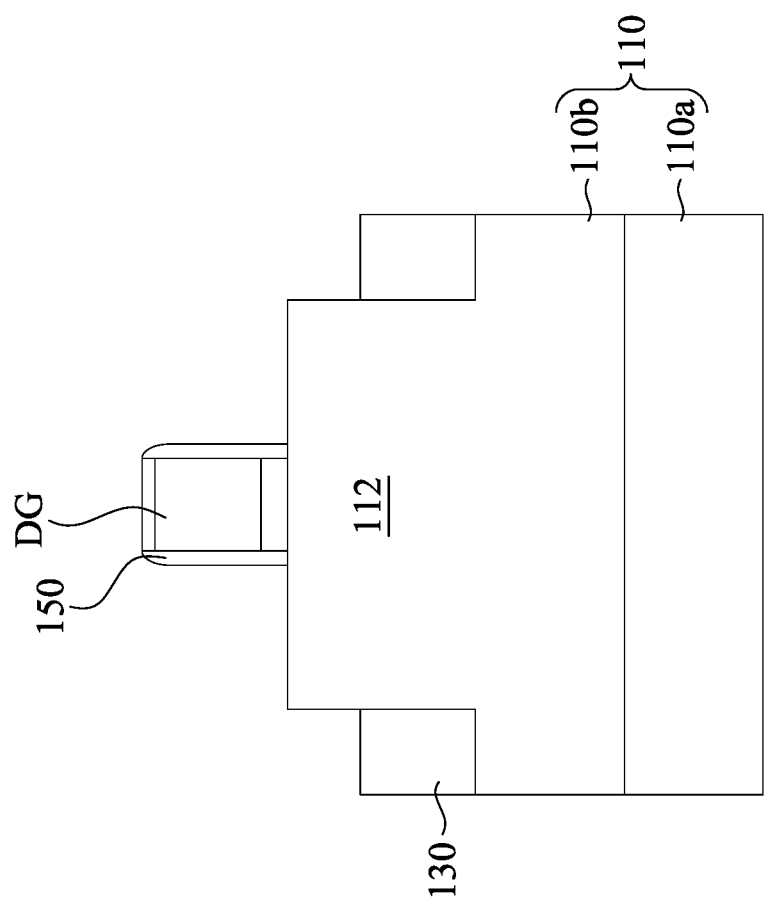

Reference is made to FIGS. 17A-17C. FIG. 17A is a schematic top view of the integrated circuit device at an intermediate stage of the manufacturing method according to some embodiments of the present disclosure. FIG. 17B is a cross-sectional view taken along line B-B of FIG. 17A. FIG. 17C is a cross-sectional view taken along line C-C of FIG. 17A. The spacer material layer 160 (referring to FIG. 16) is patterned to form spacers 161-162 on opposite sidewalls of the fin 112b and spacers 163-164 on opposite sidewalls of the fin 112c. The patterning process may include suitable etching process. By the etching process, the portions of the spacer material layer 160 free of coverage of the patterned mask P2' (referring to FIG. 16) is removed and etched away, while a portion of the spacer material layer 160 covered by the patterned mask P2' (referring to FIG. 16) is protected from being etched. The remaining portion of the spacer material layer 160 (referring to FIG. 16) may be referred to as a spacer, which includes the spacers 161-164.

In the present embodiments, the remaining portion of the spacer material layer 160 (referring to FIG. 16) further forms a portion 169 extending horizontally over the ST features 130 and connecting between the spacers 162 and 163. In some other embodiments, the patterned mask P2' (referring to FIG. 16) may be designed in another way such that the portion 169 is etched away, and the spacer 162 may be spaced apart from the spacer 163. After the patterning process, the patterned mask P2' (referring to FIG. 16) may be removed by suitable stripping process.

In the present embodiments, the sidewalls of the fins 112a and 112d facing the semiconductor fins 112b and 112c may be free of a fin sidewall spacer. In alternative embodiments, other fin sidewall spacers may be formed on sidewalls of the fins 112a and 112d facing the semiconductor fins 112b and 112c with a top lower than that of the spacers 161-164.

Figure 18B:
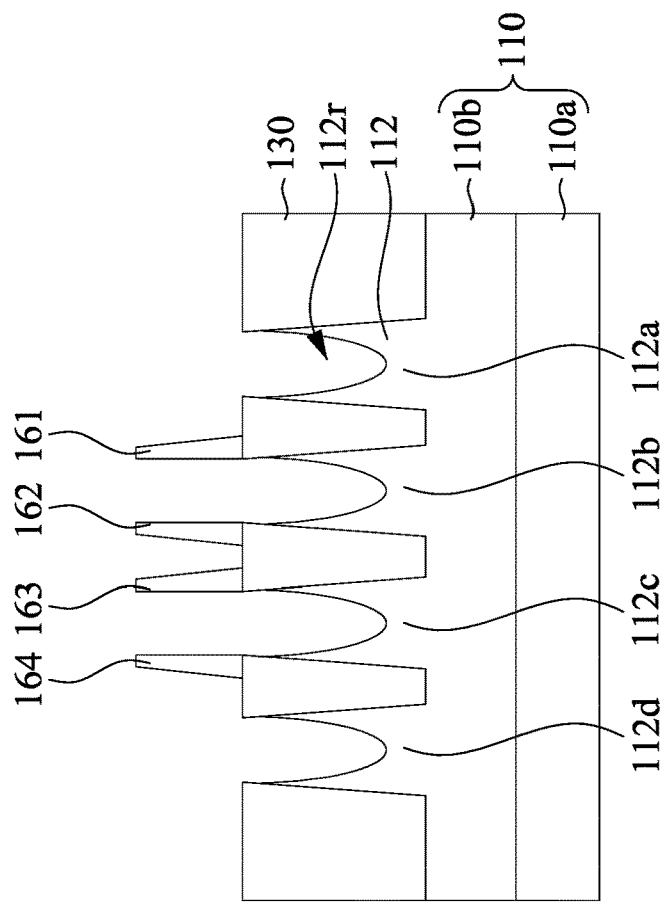
Figure 18A:
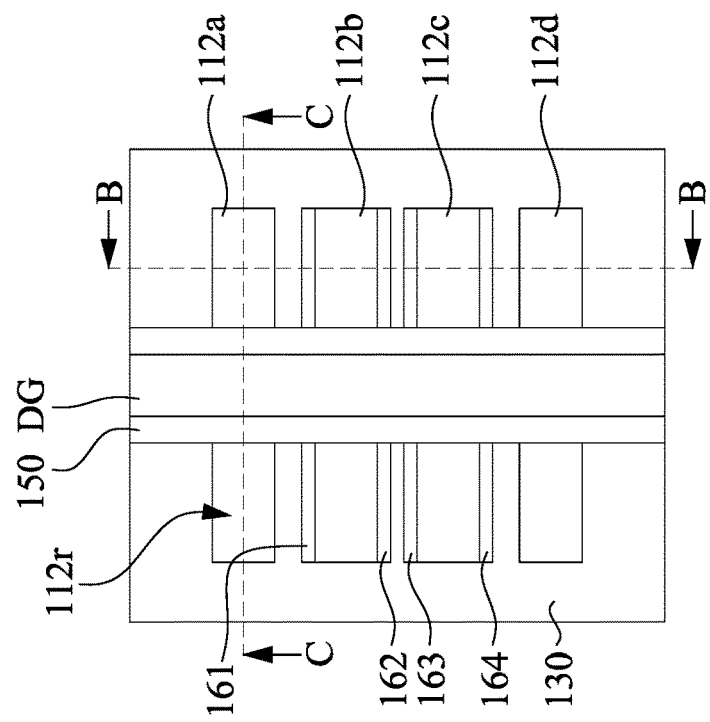
Figure 18C:
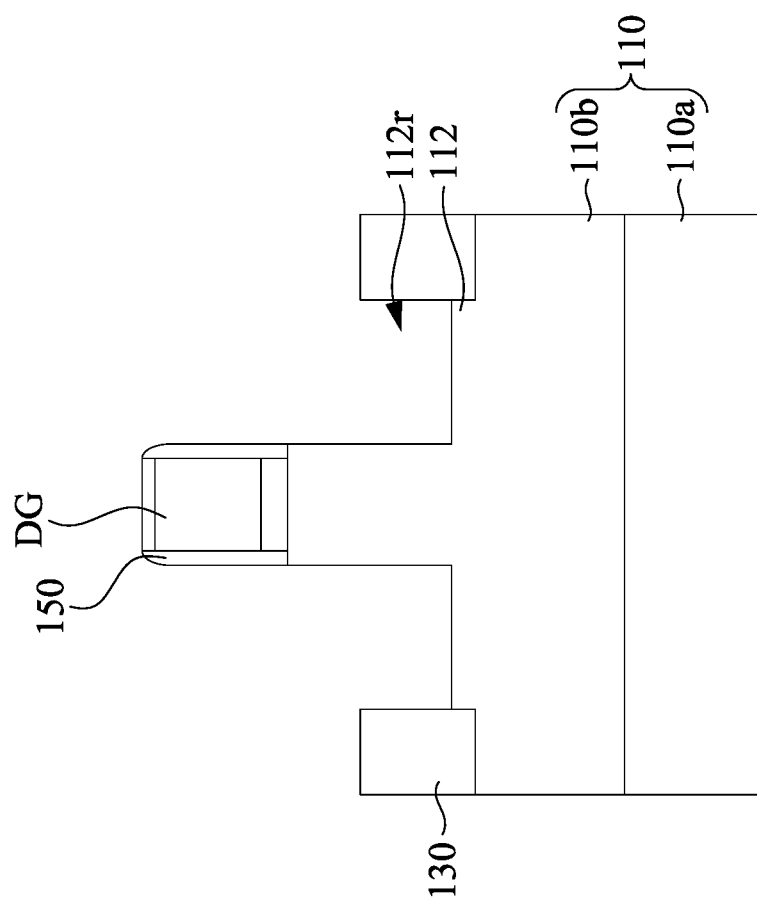

Reference is made to FIGS. 18A-18C. FIG. 18A is a schematic top view of the integrated circuit device at an intermediate stage of the manufacturing method according to some embodiments of the present disclosure. FIG. 18B is a cross-sectional view taken along line B-B of FIG. 18A. FIG. 18C is a cross-sectional view taken along line C-C of FIG. 18A. Exposed portions of the semiconductor fins 112 are etched by using the dummy gate structure DG, the gate spacers 150, and the STI features 130 as an etch mask, resulting in recesses 112r into the semiconductor fins 112. In some embodiments, the etching process may be a dry etching, a wet etch, or the combination thereof. In some embodiments, the portion 169 (referring to FIG. 17B) may be removed by the etching process, such that the spacer 162 and 163 are disconnected from each other. In some embodiments, the etching process may also lower top surfaces of the spacer 161-164.

Figure 19B:
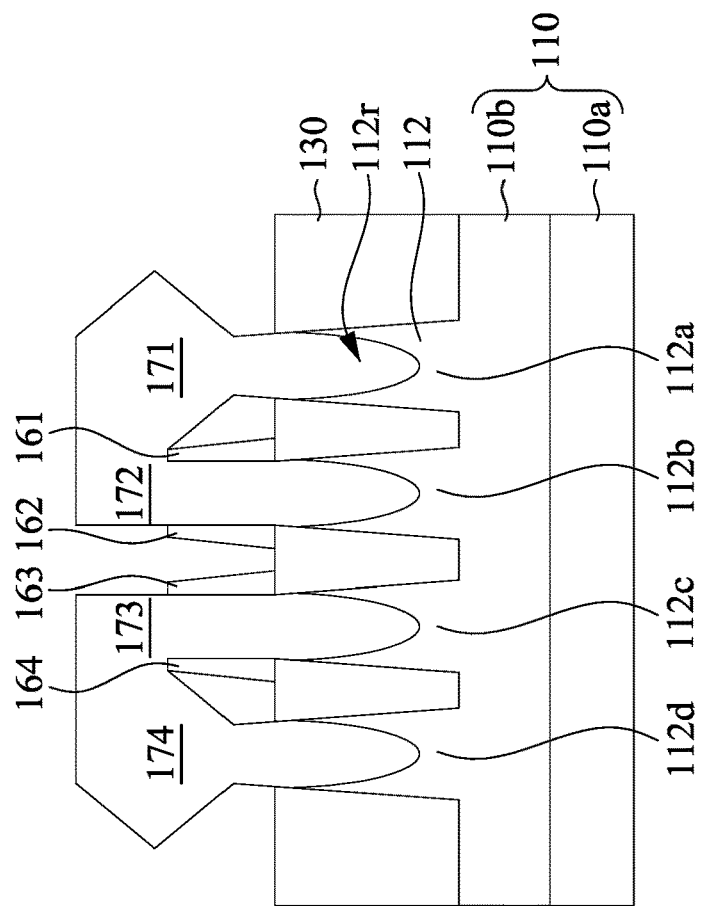
Figure 19A:
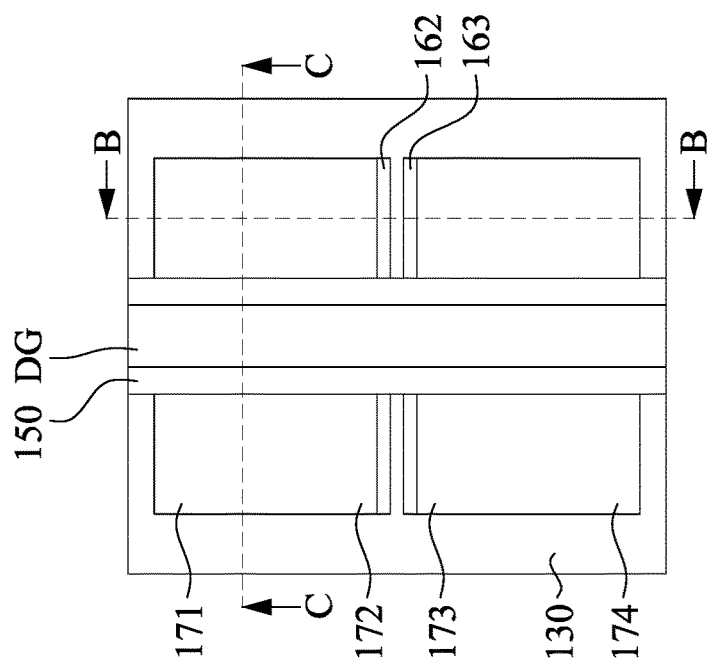
Figure 19C:
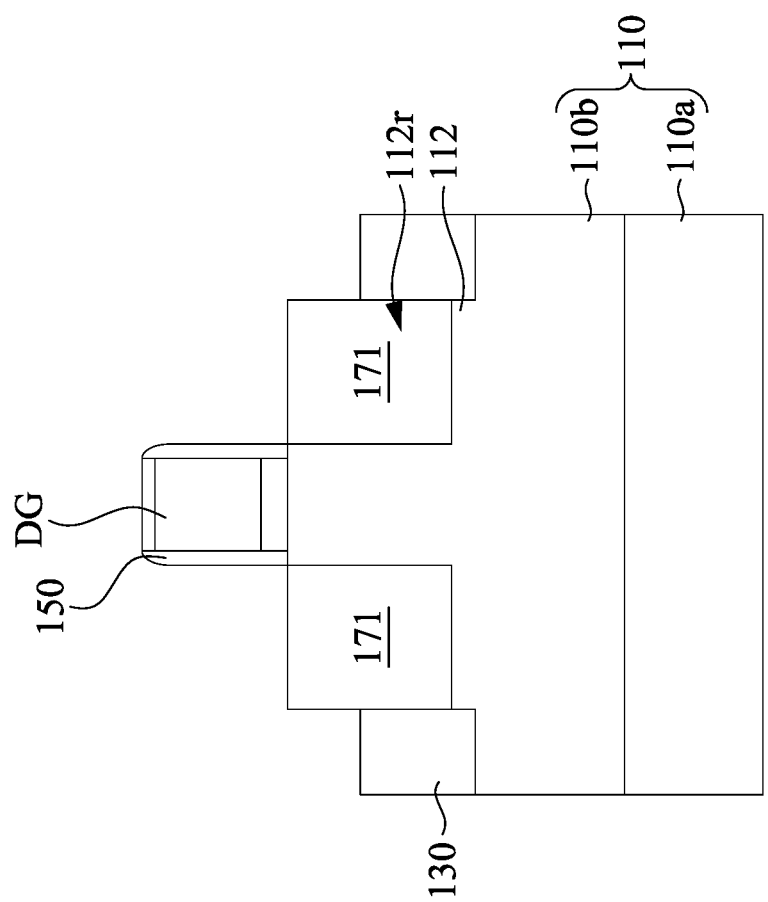

Reference is made to FIGS. 19A-19C. FIG. 19A is a schematic top view of the integrated circuit device at an intermediate stage of the manufacturing method according to some embodiments of the present disclosure. FIG. 19B is a cross-sectional view taken along line B-B of FIG. 19A. FIG. 19C is a cross-sectional view taken along line C-C of FIG. 19A. Epitaxial features 171-174 are respectively formed over the exposed portions of the semiconductor fins 112a-112d. In some embodiments, the epitaxial features 171-174 may include Ge, Si, GaAs, AlGaAs, SiGe, GaAsP, SiP, or other suitable material. The epitaxial features 171-174 may be in-situ doped during the epitaxial process by introducing doping species including: p-type dopants, such as boron or $BF_2$; n-type dopants, such as phosphorus or arsenic; and/or other suitable dopants including combinations thereof. If the epitaxial features 171-174 are not in-situ doped, an implantation process (i.e., a junction implant process) is performed to dope the epitaxial features 171-174.

The epitaxial features 171-174 may be formed by performing an epitaxial growth process that provides an epitaxial material on the fins 112a-112d. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the fins 112a-112d.

In some further embodiments, the epitaxial growth of the epitaxial feature 172 is confined by the fin sidewall spacers 161 and 162, and the epitaxial growth of the epitaxial feature 173 is confined by the fin sidewall spacers 163 and 164. Through the confinement, the epitaxial features 172 and 173 are preventing from being merged with each other.

In the present embodiments, the epitaxial growth of the epitaxial feature 171 is less or not confined by a fin sidewall spacer, such that the epitaxial feature 171 may extend laterally more than the epitaxial feature 173 extends. Through the configuration, the epitaxial feature 172 is merged with the epitaxial feature 171 and spaced apart from the epitaxial feature 173.

Similarly, in the present embodiments, the epitaxial growth of the epitaxial feature 174 is less or not confined by a fin sidewall spacer, such that the epitaxial feature 174 may extend laterally more than the epitaxial feature 172 extends. Through the configuration, the epitaxial feature 173 is merged with the epitaxial feature 174 and spaced apart from the epitaxial feature 172.

Figure 20B:
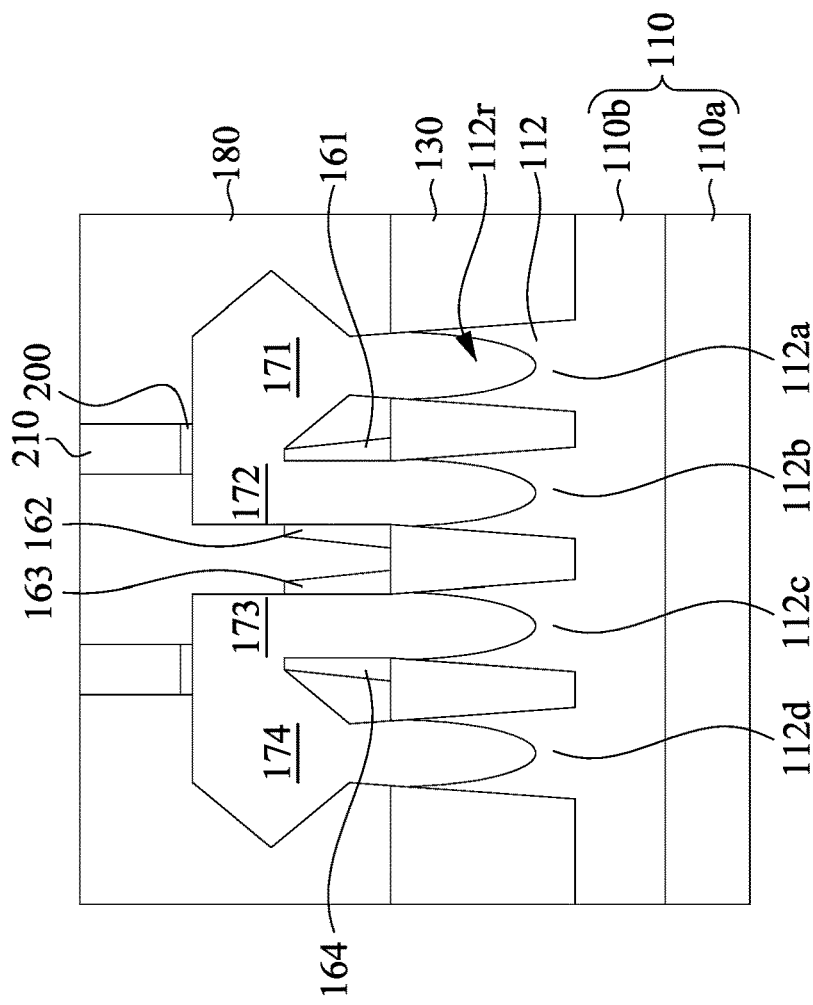
Figure 20A:
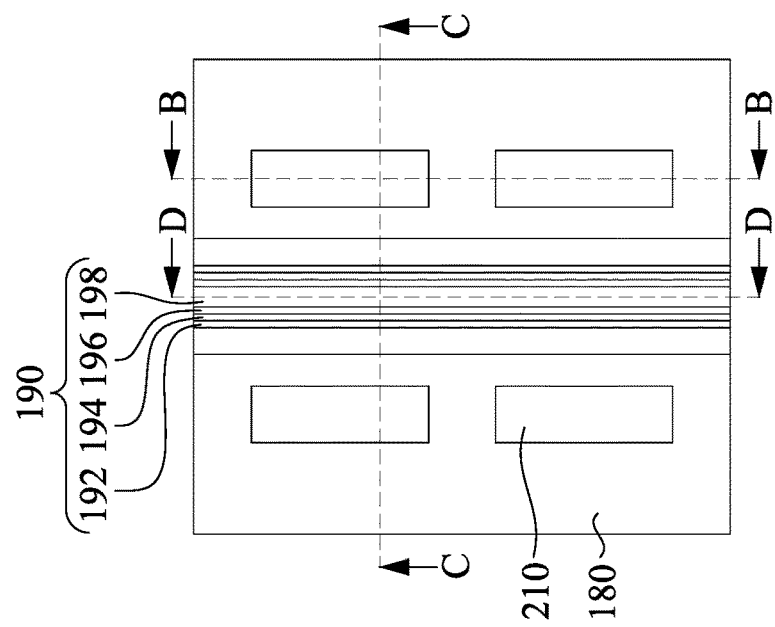
Figure 20D:
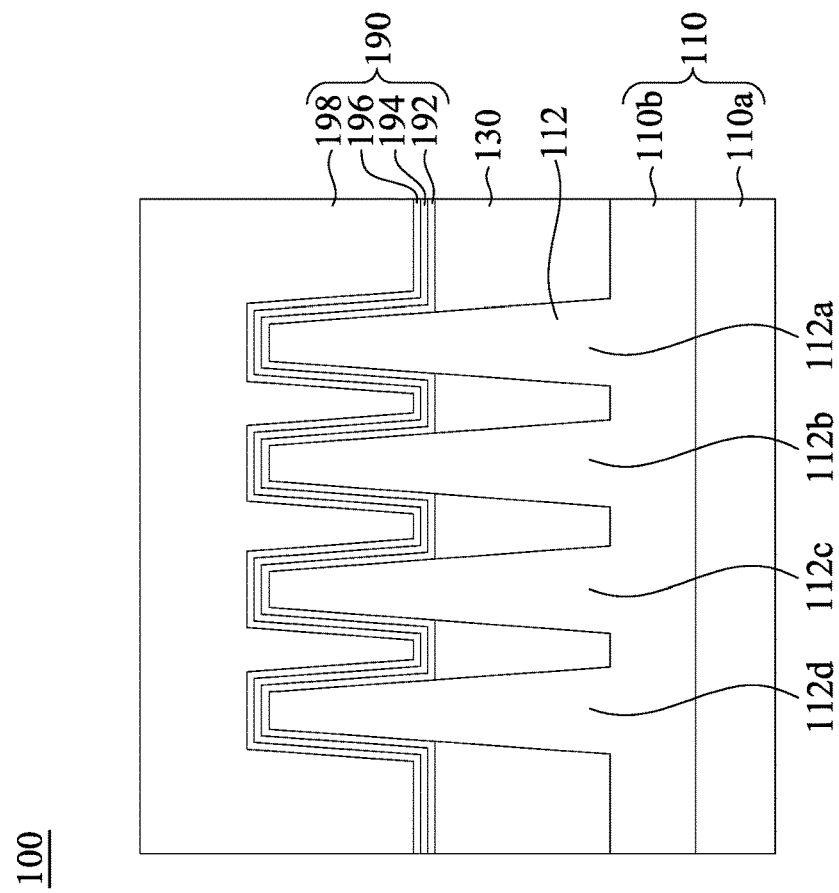
Figure 20C:
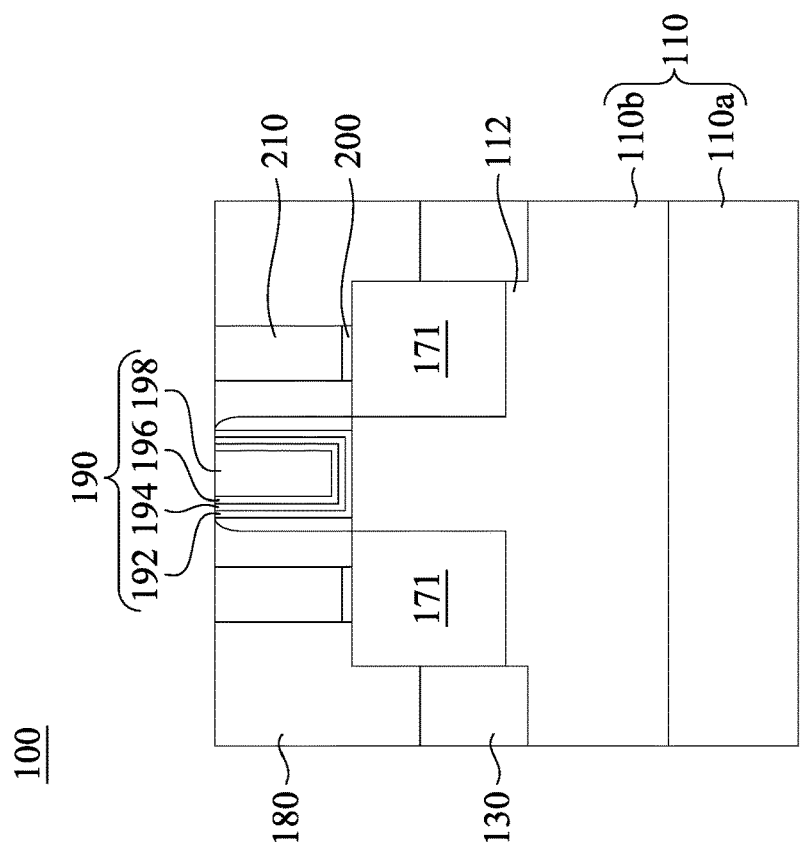

Reference is made to FIGS. 20A-20D. FIG. 20A is a schematic top view of the integrated circuit device 100 according to some embodiments of the present disclosure. FIG. 20B is a cross-sectional view taken along line B-B of FIG. 20A. FIG. 20C is a cross-sectional view taken along line C-C of FIG. 20A. FIG. 20D is a cross-sectional view taken along line D-D of FIG. 20A. An ILD layer 180 is formed on the substrate 110. Subsequently, the dummy gate structure DG (referring to FIG. 19A) is replaced with the metal gate structure 190. Contacts 210 are formed in the ILD layer 180 and over the epitaxial features 171-174. Other details of the present embodiments are similar to those mentioned in the embodiments of FIGS. 6A to 14D, and therefore not repeated herein.

Figure 21:
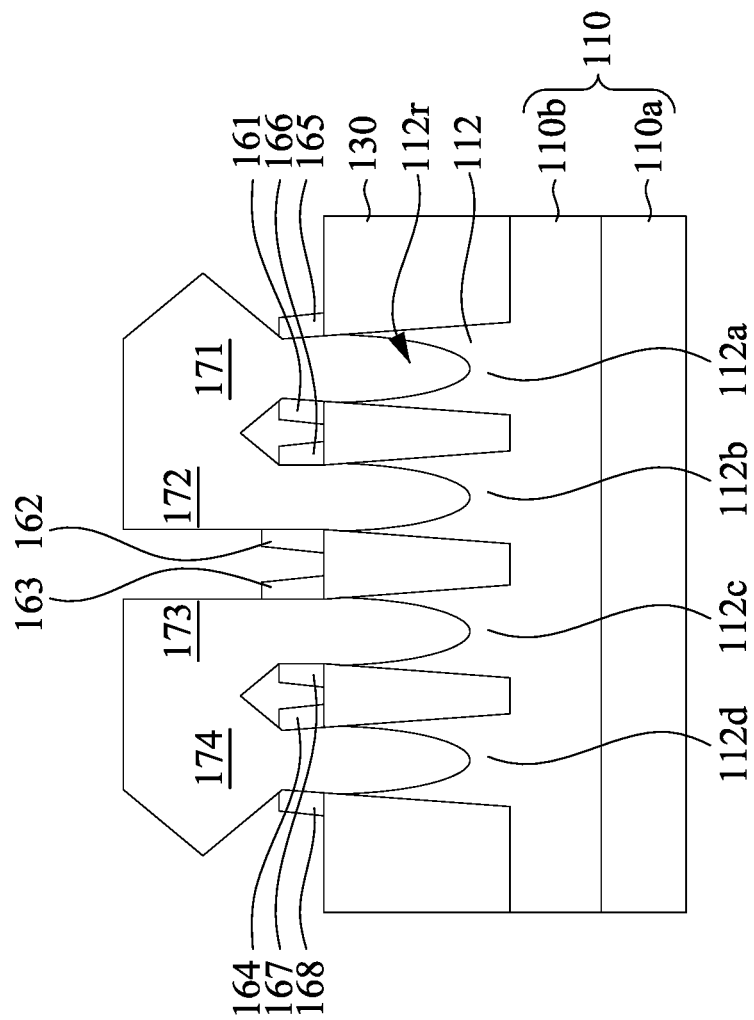
FIG. 21 is a cross-sectional view of an integrated circuit device in accordance with some embodiments of the present disclosure.

FIG. 21 is a cross-sectional view of an integrated circuit device 100 in accordance with some embodiments of the present disclosure, and FIG. 21 is taken along the same cut as in FIG. 20B. The present embodiments are similar to the embodiments of FIGS. 15A to 20C, except that the patterning process performed to the spacer material layer 160 (referring to FIGS. 16-17C) further form spacers 165-166 on opposite sidewalls of the fin 112a, and spacers 167-168 on opposite sidewalls of the fin 112d. In some embodiments, the height of the spacers 165-168 is less than the height of the spacers 162 and 163. For example, top surfaces of the spacers 165-168 are at a position lower than top surfaces of the spacers 162-163.

Through the configuration, in the present embodiments, the epitaxial growth of the epitaxial feature 171 is less confined by the fin sidewall spacers 165-166 than the epitaxial growth of the epitaxial feature 173 being confined by the fin sidewall spacers 163-164. Therefore, the epitaxial feature 171 may extend laterally more than the epitaxial feature 173 extends, which in turn result in that the epitaxial feature 172 is merged with the epitaxial feature 171 and spaced apart from the epitaxial feature 173. Similarly, in the present embodiments, the epitaxial growth of the epitaxial feature 174 is less confined by the fin sidewall spacers 167-168 than the epitaxial growth of the epitaxial feature 172 being confined by the fin sidewall spacers 161-162. Therefore, the epitaxial feature 174 may extend laterally more than the epitaxial feature 172 extends, which in turn result in that the epitaxial feature 173 is merged with the epitaxial feature 174 and spaced apart from the epitaxial feature 172.

In some embodiments, the height of the spacers 161 and 164 is less than the height of the spacers 162 and 163, for example, being substantially equal to the height of the spacers 165-168. For example, top surfaces of the spacers 161 and 164 are at a position lower than top surfaces of the spacers 162-163, and substantially at the same level as top surfaces of the spacers 165-168. The lower spacer 161 allows the epitaxial feature 172 to extend laterally toward the epitaxial feature 171, which is beneficial for the merge between the epitaxial features 171 and 172. Similarly, the lower spacer 164 allows the epitaxial feature 173 to extend laterally toward the epitaxial feature 174, which is beneficial for the merge between the epitaxial features 173 and 174. In some alternative embodiments, the height of the spacers 161 and 164 is greater than the height of the spacers 165-168, for example, being substantially equal to the height of the spacers 162 and 163. For example, top surfaces of the spacers 161 and 164 are at a position higher than top surfaces of the spacers 165-168, and may be substantially at the same level as top surfaces of the spacers 162-163. Other details of the present embodiments is similar to those mentioned above, and therefore not repeated herein.

FIGS. 22 to 27D illustrate a method for manufacturing an integrated circuit device 100 at various stages in accordance with some embodiments of the present disclosure. It is understood that additional operations may be provided before, during, and after the operations shown by FIGS. 22 to 27D, and some of the operations described below can be replaced or eliminated for additional embodiments of the method. The order of the operations/processes may be interchangeable.

Figure 22:
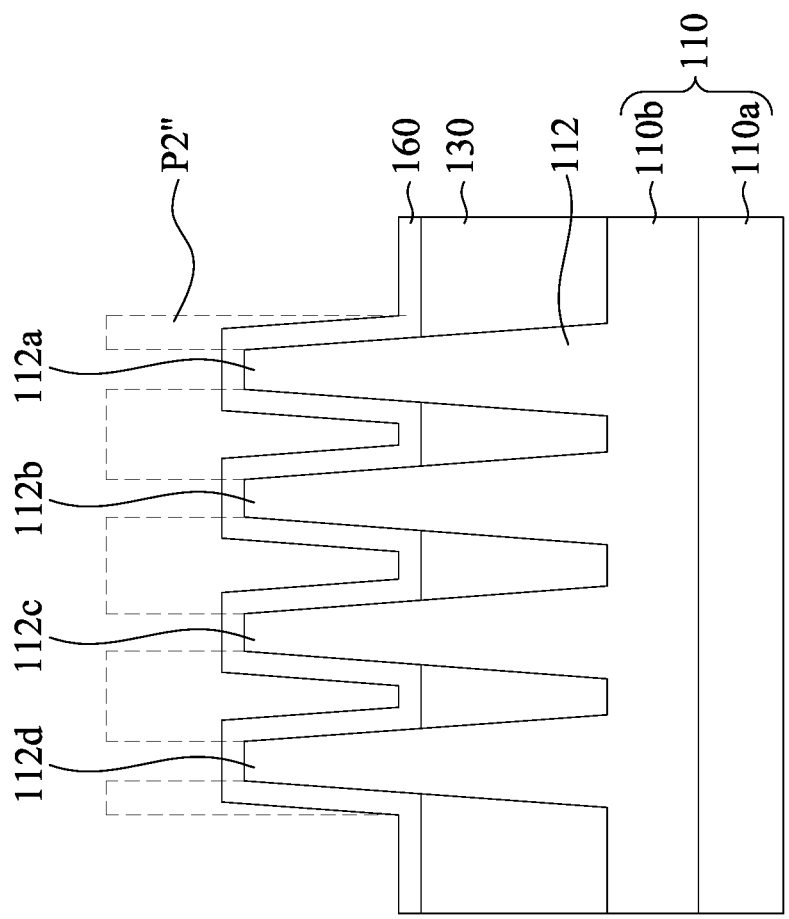
FIGS. 22 to 27D illustrate a method for manufacturing an integrated circuit device at various stages in accordance with some embodiments of the present disclosure.

Reference is made to FIG. 22. FIG. 22 is a cross-sectional view taken of the integrated circuit device at an intermediate stage of the manufacturing method according to some embodiments of the present disclosure, and FIG. 22 is taken along the same cut as in FIGS. 10 and 16. A spacer material layer 160 extends over top surfaces of the STI features 130, sidewalls of the fins 112a-112d, and top surfaces of the fins 112a-112d. Other details regarding the structure of FIG. 22 and the method for forming the structure of FIG. 22 are similar to those mentioned above (e.g., in FIGS. 10 and 16), and not repeated herein.

In some embodiments, a patterned mask P2" is formed over a portion of the spacer material layer 160. The patterned mask P2" may be a photoresist for protecting the spacer material layer 160 against subsequent etching process. The patterned mask P2' may be formed by photolithography patterning processes, including photoresist coating (e.g., spin-on coating), soft baking, mask aligning, exposure, post-exposure baking, developing the photoresist, rinsing, drying (e.g., hard baking), and/or other applicable processes. In some other embodiments, the patterned mask P2" may be a hard mask for protecting the spacer material layer 160 against subsequent etching process.

Figure 23C:
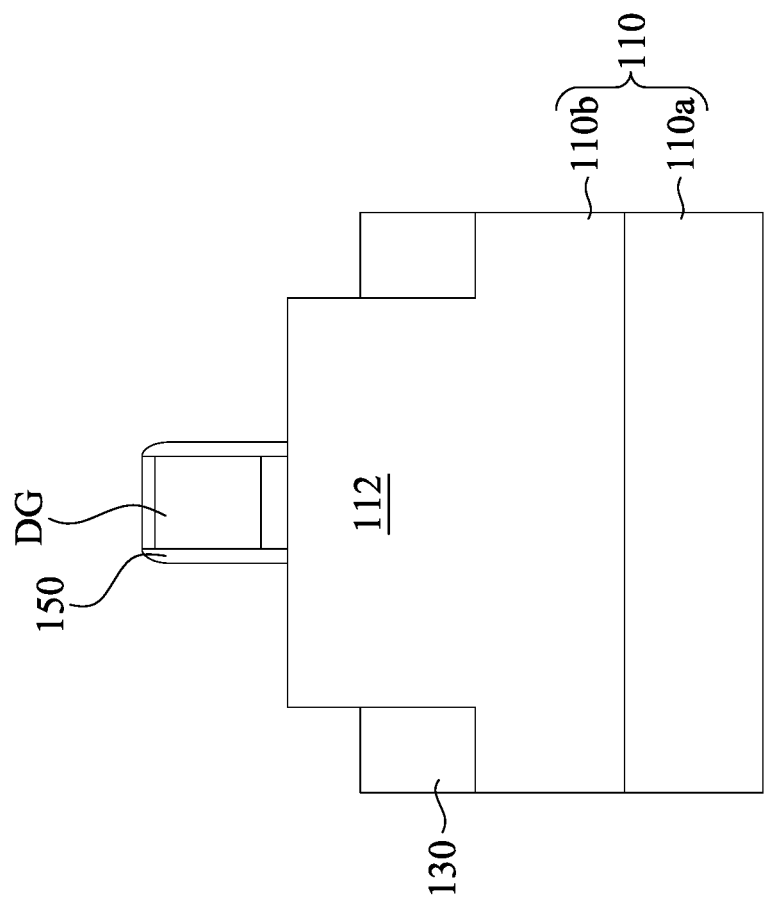

Reference is made to FIGS. 23A-23C. FIG. 23A is a schematic top view of the integrated circuit device at an intermediate stage of the manufacturing method according to some embodiments of the present disclosure. FIG. 23B is a cross-sectional view taken along line B-B of FIG. 23A. FIG. 23C is a cross-sectional view taken along line C-C of FIG. 23A. The spacer material layer 160 (referring to FIG. 22) is patterned to expose top surfaces of the fins 112a-112d. The patterning process may include suitable etching process. By the etching process, portions of the spacer material layer 160 exposed by the patterned mask P2" (referring to FIG. 22) is etched away, while a portion of the spacer material layer 160 covered by the patterned mask P2" (referring to FIG. 22) is protected from being etched. The remaining portion of the spacer material layer 160 (referring to FIG. 22) may be referred to as the spacer 160'.

After the patterning process, the spacer 160' may include spacers 161-168, in which the spacers 161-162 are on opposite sidewalls of the fin 112b, the spacers 163-164 are on opposite sidewalls of the fin 112c, the spacers 165-166 are on opposite sidewalls of the fin 112a, and the spacers 167-168 are on opposite sidewalls of the fin 112d. In some embodiments, the spacer 160' further forms horizontal portions 169 extending horizontally over the ST features 130 and connecting between the spacers 162 and 163, the spacers 166 and 161, and the spacers 164 and 167. In some other embodiments, the patterned mask P2" (referring to FIG. 22) may be designed in another way such that the horizontal portions 169 are etched away, which in turn will result in that the spacer 162 is spaced apart from the spacer 163, the spacer 166 is spaced apart from the spacer 161, and the spacer 164 is spaced apart from the spacer 167. After the patterning process, the patterned mask P2" (referring to FIG. 22) may be removed by suitable stripping process. In some other embodiments, the patterning process may include suitable anisotropic etching process without using the patterned mask P2" (referring to FIG. 22) since the anisotropic etching process does not entirely remove the vertical portions the spacer material layer 160 (referring to FIG. 22).

Figure 24B:
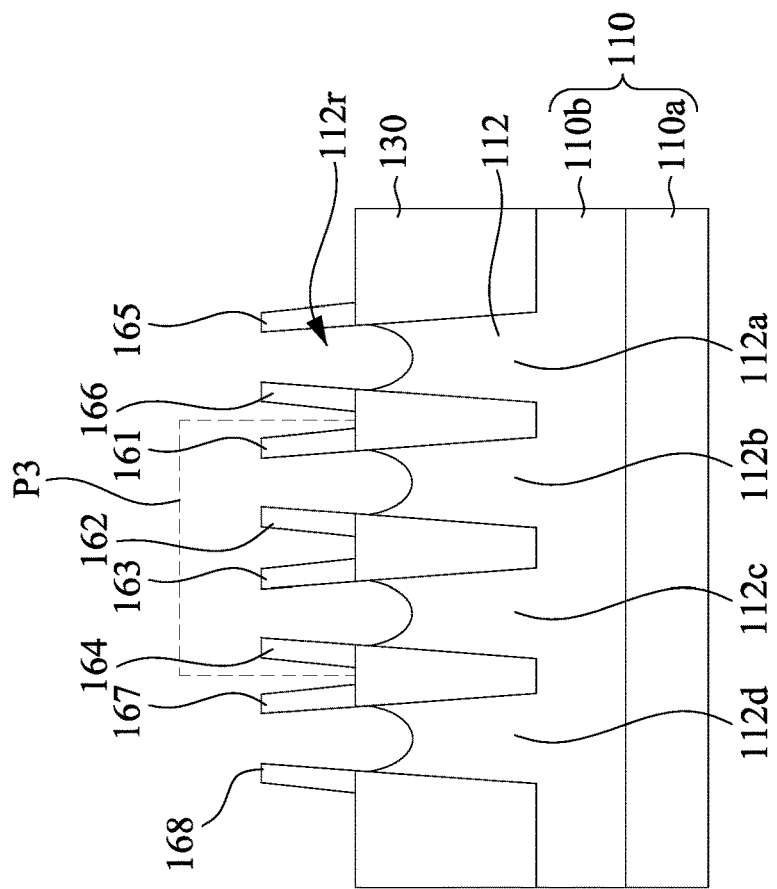
Figure 24A:
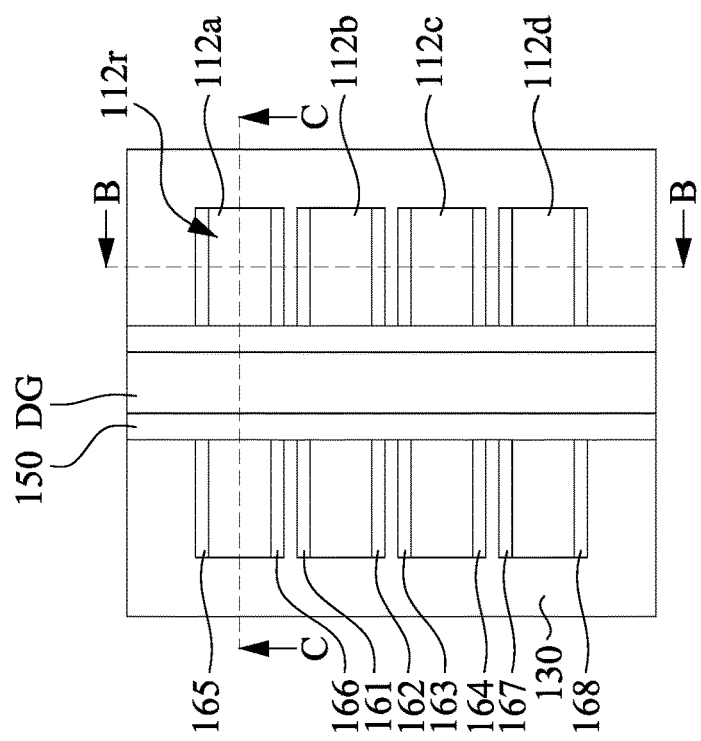
Figure 24C:
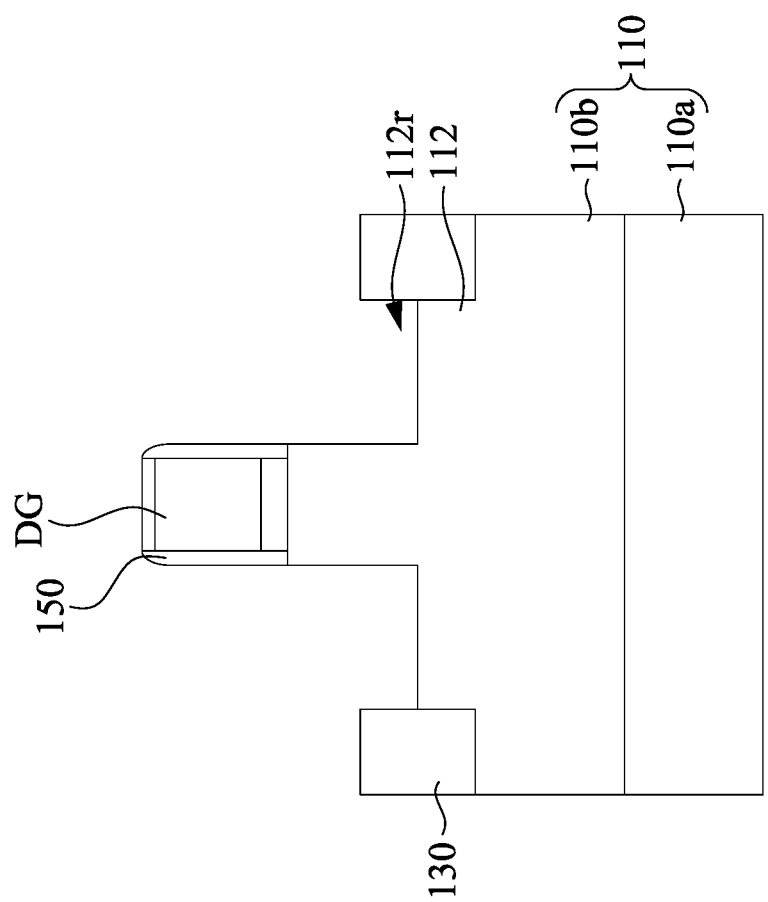

Reference is made to FIGS. 24A-24C. FIG. 24A is a schematic top view of the integrated circuit device at an intermediate stage of the manufacturing method according to some embodiments of the present disclosure. FIG. 24B is a cross-sectional view taken along line B-B of FIG. 24A. FIG. 24C is a cross-sectional view taken along line C-C of FIG. 24A. Exposed portions of the semiconductor fins 112a-112d are etched by using the dummy gate structure DG, the gate spacers 150, and the STI features 130 as an etch mask, resulting in recesses 112r into the semiconductor fins 112a-112d. In some embodiments, the etching process may be a dry etching, a wet etch, or the combination thereof. In some embodiments, the horizontal portions 169 (referring to FIG. 23B) may be removed by the etching process, which in turn will result in that the spacer 162 is spaced apart from the spacer 163, the spacer 166 is spaced apart from the spacer 161, and the spacer 164 is spaced apart from the spacer 167. In some embodiments, the etching process may also lower top surfaces of the spacer 161-168.

After the formation of the recesses 112r, a patterned mask P3 may be formed over the semiconductor fins 112b and 112c and the spacers 161-164, and expose the semiconductor fins 112a and 112d and the spacers 165-168. The patterned mask P3 may be a photoresist for protecting the semiconductor fins 112b and 112c against subsequent etching process. The patterned mask P3 may be formed by photolithography patterning processes, including photoresist coating (e.g., spin-on coating), soft baking, mask aligning, exposure, post-exposure baking, developing the photoresist, rinsing, drying (e.g., hard baking), and/or other applicable processes. In some other embodiments, the patterned mask P3 may be a hard mask for protecting the spacers 161-164 against subsequent etching process.

Figure 25B:
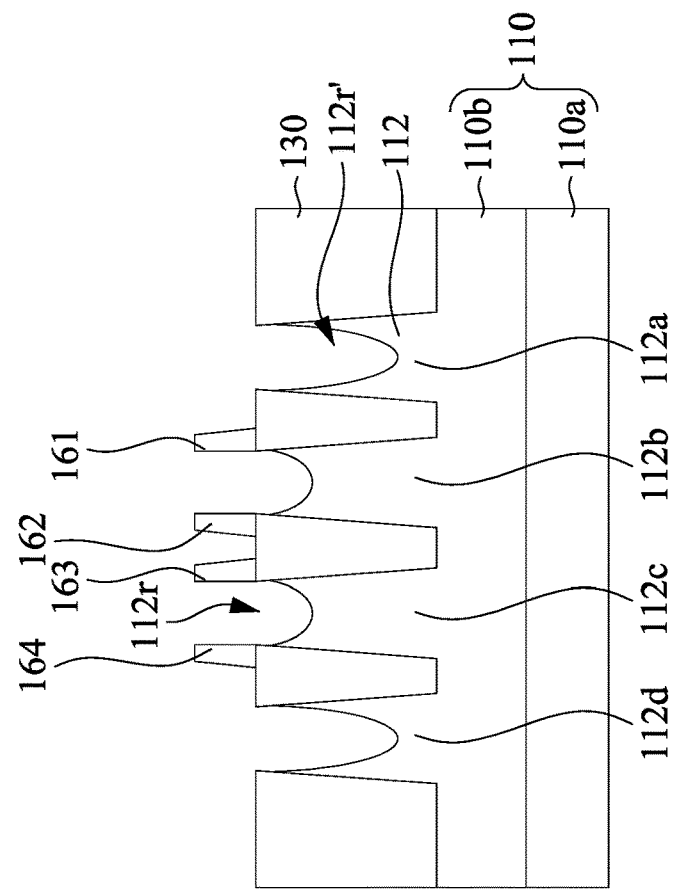
Figure 25A:
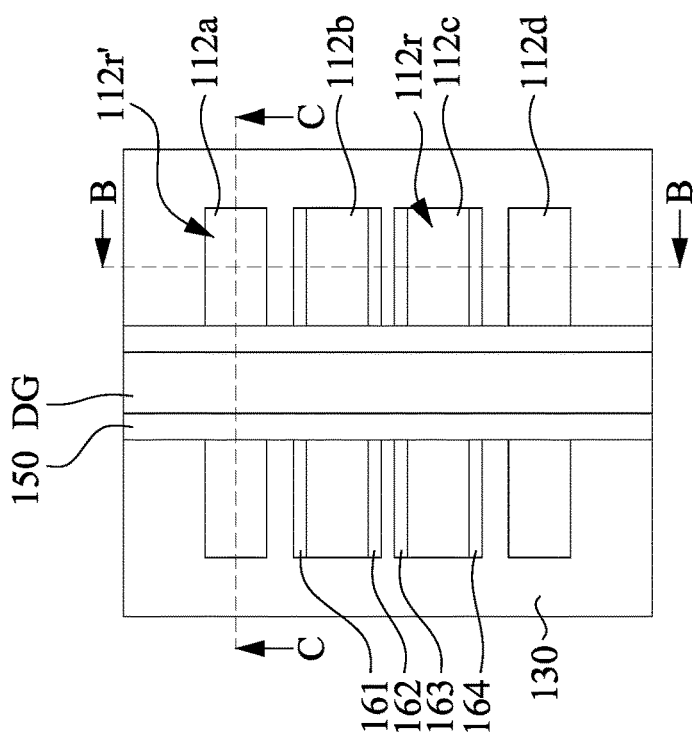
Figure 25C:
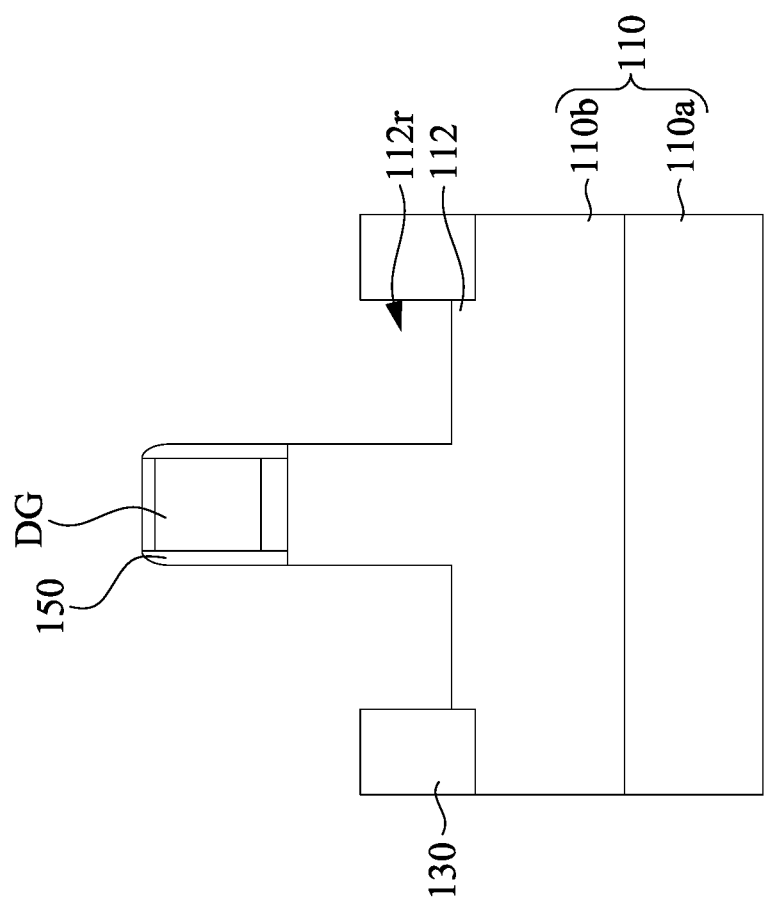

Reference is made to FIGS. 25A-25C. FIG. 25A is a schematic top view of the integrated circuit device at an intermediate stage of the manufacturing method according to some embodiments of the present disclosure. FIG. 25B is a cross-sectional view taken along line B-B of FIG. 25A. FIG. 25B is a cross-sectional view taken along line B-B of FIG. 25C. The exposed portions of the semiconductor fins 112a and 112d are further recessed by suitable etching process, thereby deepening the recesses 112r (referring to FIG. 24B) in the 112a and 112d. The deepened recesses 112r (referring to FIG. 24B) in the fins 112a and 112d are referred to as recesses 112C hereinafter. The etching process may use the dummy gate structure DG, the gate spacers 150, the STI features 130, and the patterned mask P3 as an etch mask. In some embodiments, the etching process may be a dry etching, a wet etch, or the combination thereof. In some embodiments, the spacers 165-168 may be etched and/or removed by the etching process. Through the recessing portions of the semiconductor fins 112a and 112d, a top surface of the recessed portions of the semiconductor fins 112a and 112d is lower than a top surface of recessed portions of the second semiconductor fins 112b and 112c.

In some other embodiments, the patterned mask P3 (referring to FIG. 24B) may be formed over the semiconductor fins 112b and 112c and the spacers 162 and 163, and expose the semiconductor fins 112a and 112d and the spacers 161 and 164-168. In some other embodiments, the spacers 161 and 164-168 may be etched and/or removed by the etching process.

Figure 26B:
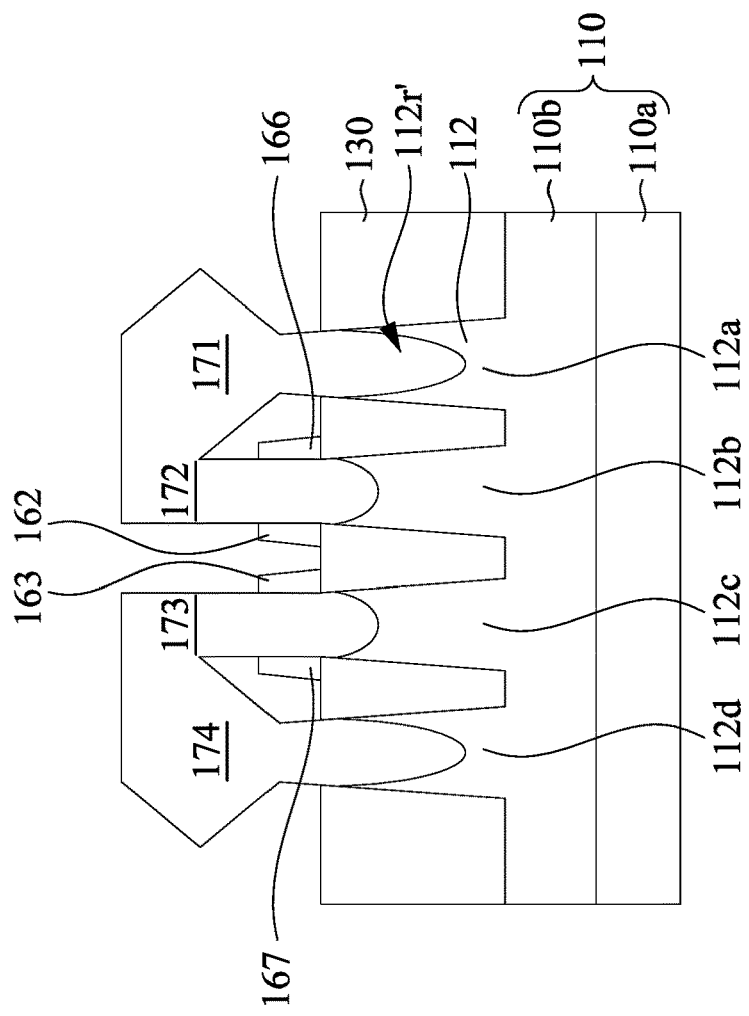
Figure 26A:
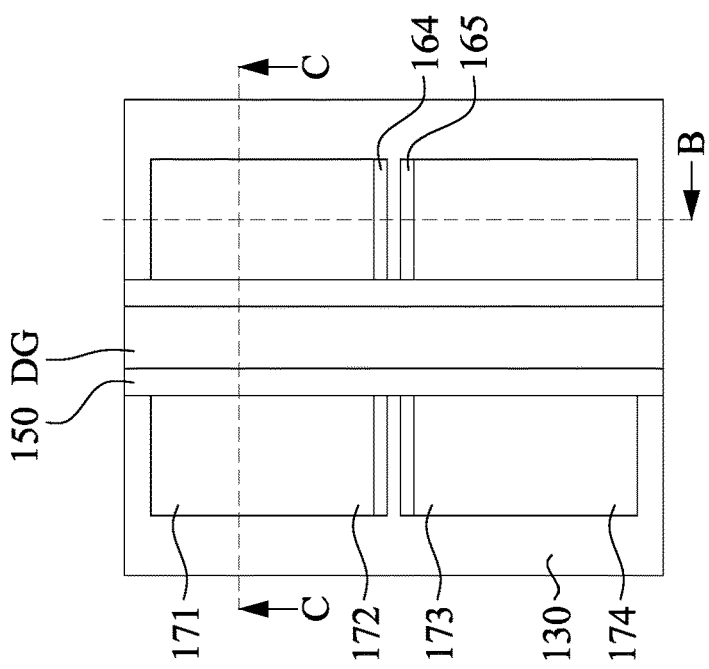
Figure 26C:
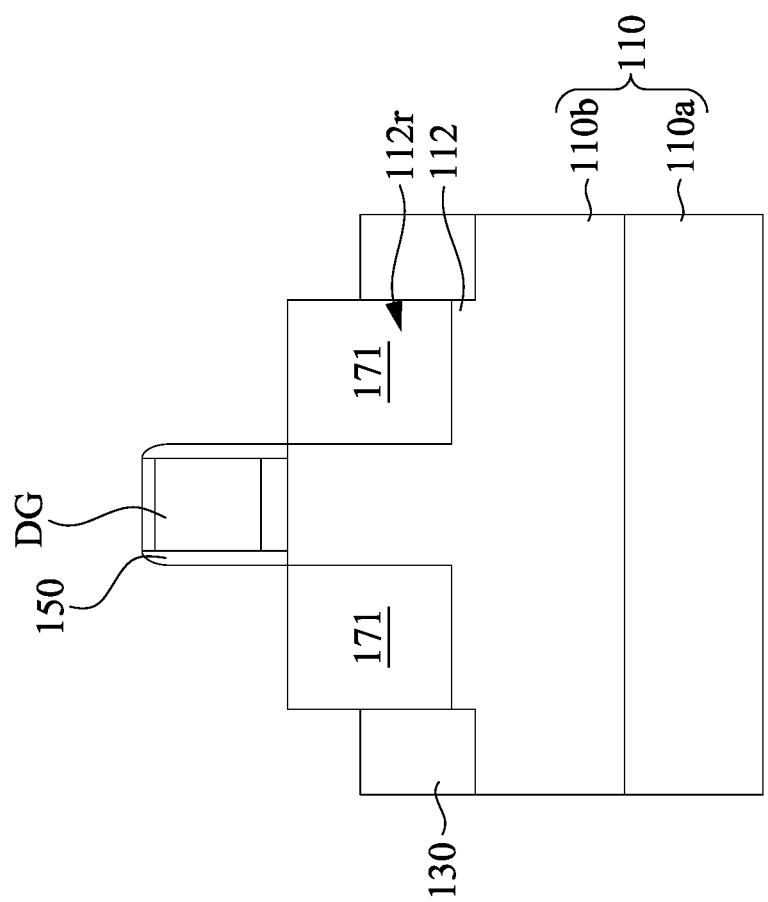

Reference is made to FIGS. 26A-26C. FIG. 26A is a schematic top view of the integrated circuit device at an intermediate stage of the manufacturing method according to some embodiments of the present disclosure. FIG. 26B is a cross-sectional view taken along line B-B of FIG. 26A. FIG. 26C is a cross-sectional view taken along line C-C of FIG. 26A. Epitaxial features 171-174 are respectively formed over the exposed portions of the semiconductor fins 112a-112d. In some embodiments, the epitaxial features 171-174 may include Ge, Si, GaAs, AlGaAs, SiGe, GaAsP, SiP, or other suitable material. The epitaxial features 171-174 may be in-situ doped during the epitaxial process by introducing doping species including: p-type dopants, such as boron or $BF_2$; n-type dopants, such as phosphorus or arsenic; and/or other suitable dopants including combinations thereof. If the epitaxial features 171-174 are not in-situ doped, an implantation process (i.e., a junction implant process) is performed to dope the epitaxial features 171-174.

The epitaxial features 171-174 may be formed by performing an epitaxial growth process that provides an epitaxial material on the fins 112a-112d. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the fins 112a-112d.

In the present embodiments, since the recesses 112r' is deeper than the recess 112r, sizes of the epitaxial features 171 and 174 grown from the recess 112r' are greater than sizes of the epitaxial features 172 and 173 grown from the recess 112r. For example, widths and heights of the epitaxial features 171 and 174 are greater than widths and heights of the epitaxial features 172 and 173, resepectively. In some other embodiments, top surfaces of the epitaxial features 171 and 174 may be higher than top surfaces of the epitaxial features 172 and 173. Through the configuration, the epitaxial feature 172 is merged with the epitaxial feature 171 and spaced apart from the epitaxial feature 173, and the epitaxial feature 173 is merged with the epitaxial feature 174 and spaced apart from the epitaxial feature 172.

In some embodiments, the epitaxial growth of the epitaxial feature 172 is confined by the fin sidewall spacers 161 and 162, and the epitaxial growth of the epitaxial feature 173 is confined by the fin sidewall spacers 163 and 164. Through the confinement, the epitaxial features 172 and 173 are preventing from being merged with each other. In some embodiments, the epitaxial growth of the epitaxial feature 171 is less or not confined by a fin sidewall spacer, such that the epitaxial feature 171 may extend laterally more than the epitaxial feature 173 extends. Through the configuration, the epitaxial feature 172 is merged with the epitaxial feature 171 and spaced apart from the epitaxial feature 173. Similarly, in the present embodiments, the epitaxial growth of the epitaxial feature 174 is less or not confined by a fin sidewall spacer, such that the epitaxial feature 174 may extend laterally more than the epitaxial feature 172 extends. Through the configuration, the epitaxial feature 173 is merged with the epitaxial feature 174 and spaced apart from the epitaxial feature 172.

Figure 27B:
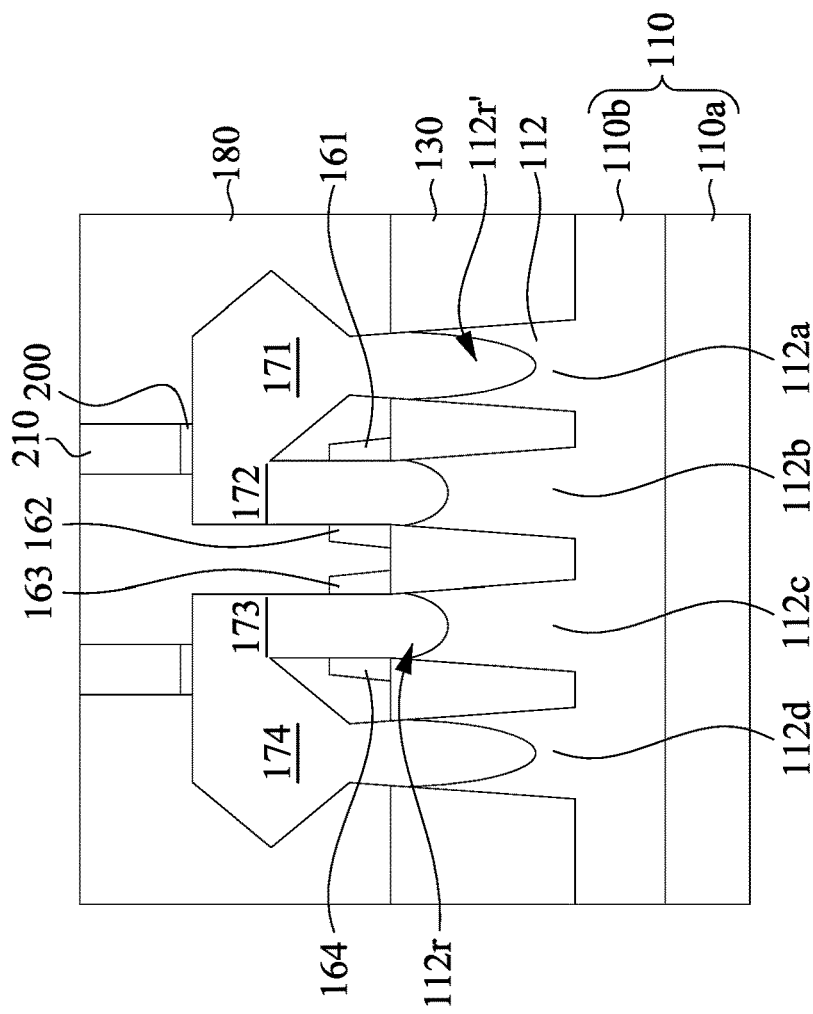
Figure 27A:
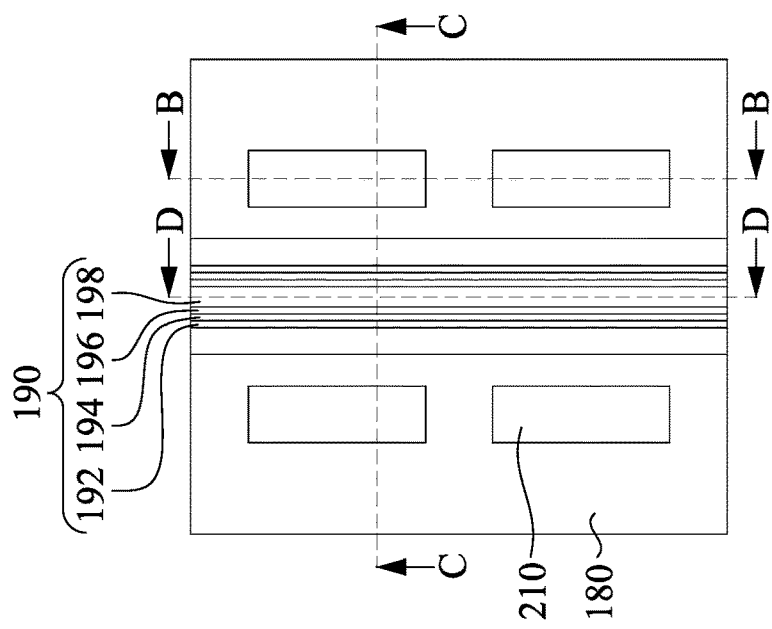
Figure 27C:
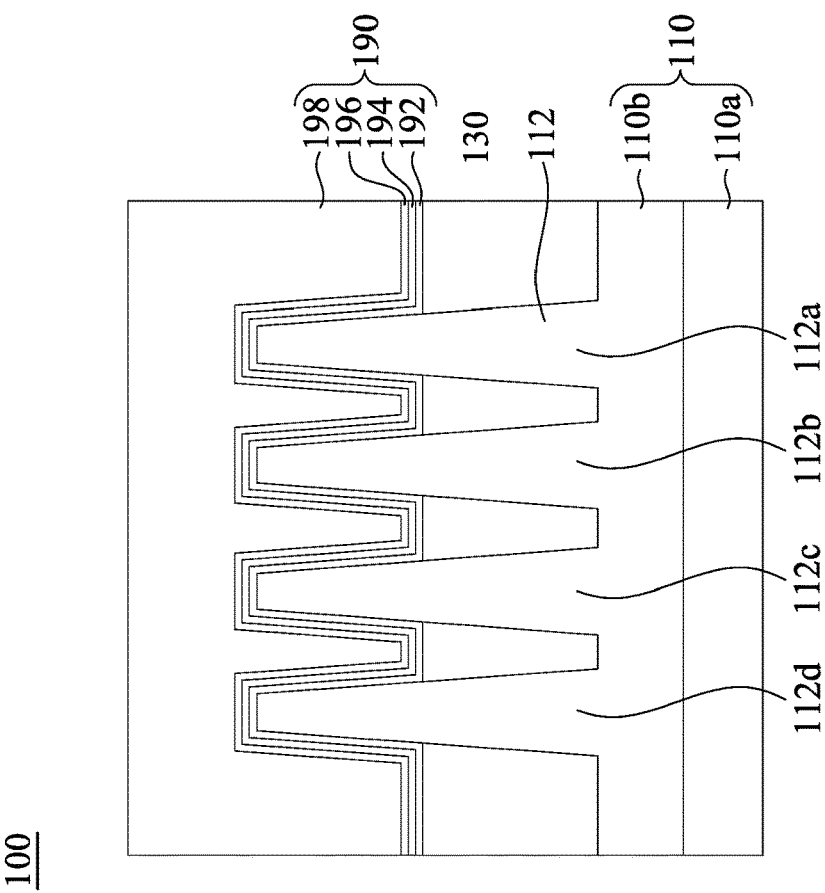
Figure 27D:
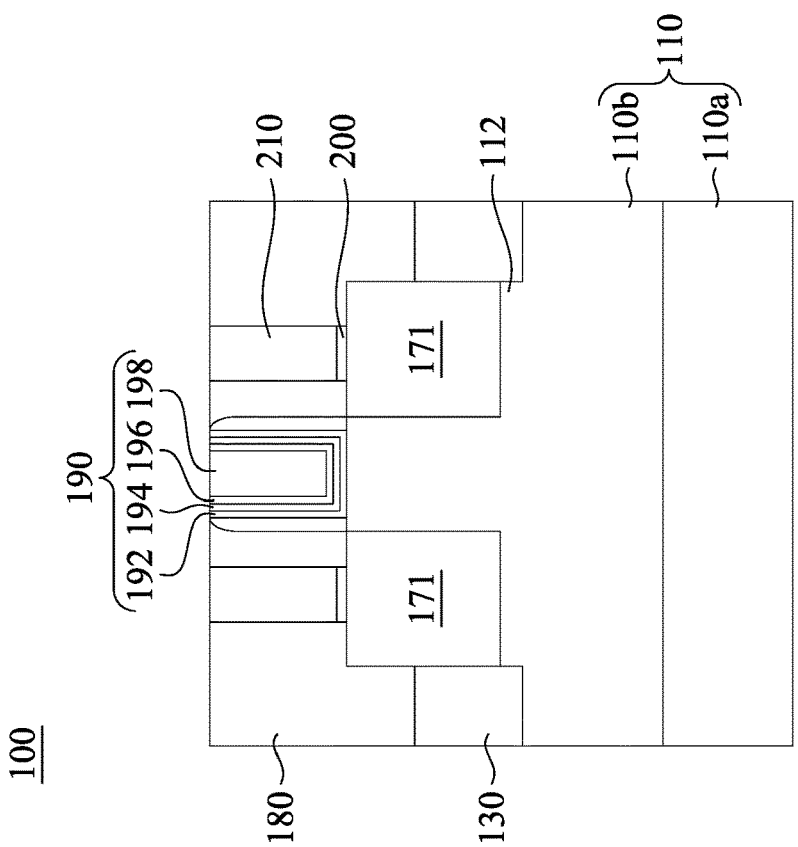

Reference is made to FIGS. 27A-27D. FIG. 27A is a schematic top view of the integrated circuit device 100 according to some embodiments of the present disclosure. FIG. 27B is a cross-sectional view taken along line B-B of FIG. 27A. FIG. 27C is a cross-sectional view taken along line C-C of FIG. 27A. FIG. 27D is a cross-sectional view taken along line D-D of FIG. 27A. An ILD layer 180 is formed on the substrate 110. Subsequently, the dummy gate structure DG is replaced with the metal gate structure 190. Contacts 210 are formed in the ILD layer 180 and over the epitaxial features 171-174. Other details of the present embodiments are similar to those mentioned above, and therefore not repeated herein.

Figure 28:
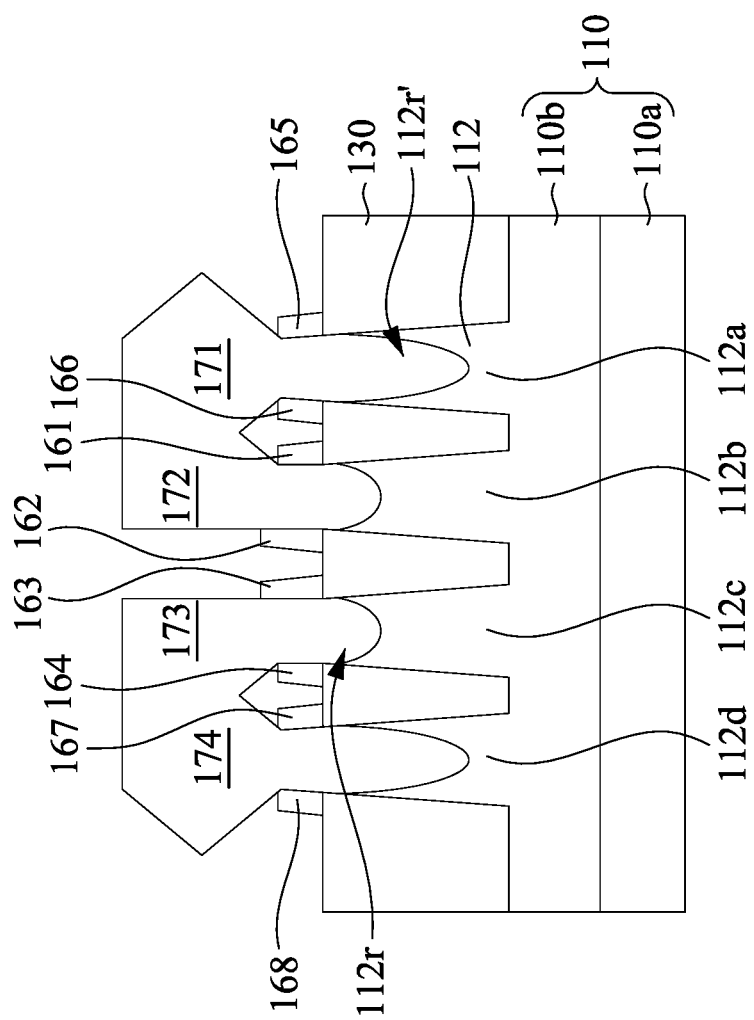
FIG. 28 is a cross-sectional view of an integrated circuit device in accordance with some embodiments of the present disclosure.

FIG. 28 is a cross-sectional view of an integrated circuit device in accordance with some embodiments of the present disclosure, and FIG. 28 is taken along the same cut as in FIG. 27B. The present embodiments are similar to the embodiments of FIGS. 22 to 27D, except that the etching process performed for deepening the recess 112r (referring to FIGS. 24A-25C) does not fully consume the spacers 165 and 166 on opposite sidewalls of the fin 112a and spacers 167 and 168 on opposite sidewalls of the fin 112d. For example, in the present embodiments, the spacers 165-168 remains on the sidewalls of the fins 112a and 112d. In some embodiments, the etching process performed for deepening the recess 112r (referring to FIGS. 24A-25C) may partially consume the spacers 165-168, thereby lowering tops of the spacers 165-168. For example, the tops of the spacers 165-168 are at a position lower than tops of the spacers 162 and 163. In some embodiments, the height of the spacers 165-168 is less than the height of the spacers 162 and 163.

In the present embodiments, the epitaxial growth of the epitaxial feature 171 is less confined by the fin sidewall spacers 165-166 than the epitaxial growth of the epitaxial feature 173 being confined by the fin sidewall spacers 163-164. Therefore, the epitaxial feature 171 may extend laterally more than the epitaxial feature 173 extends. Through the configuration, the epitaxial feature 172 is merged with the epitaxial feature 171 and spaced apart from the epitaxial feature 173.

Similarly, in the present embodiments, the epitaxial growth of the epitaxial feature 174 is less confined by the fin sidewall spacers 167-168 than the epitaxial growth of the epitaxial feature 172 being confined by the fin sidewall spacers 161-162. Therefore, the epitaxial feature 174 may extend laterally more than the epitaxial feature 172 extends. Through the configuration, the epitaxial feature 173 is merged with the epitaxial feature 174 and spaced apart from the epitaxial feature 172. Other details of the present embodiments are similar to those mentioned above, and therefore not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that through the configuration of fin sidewall spacers, the profile of the epitaxial features can be adjusted free from pitch limit, such that an epitaxial feature can be prevented from merging with an adjacent epitaxial feature. Another advantage is that the profile of an epitaxial feature can be asymmetric for merging with an adjacent epitaxial feature and spaced apart from another adjacent epitaxial feature. Still another advantage is that depths of recesses in fins would influence the size of the epitaxial features, such that a epitaxial feature cane be merged with an adjacent epitaxial feature and spaced apart from another adjacent epitaxial feature.

According to some embodiments, an integrated circuit device includes a semiconductor substrate, first and second semiconductor fins over the semiconductor substrate, and first and second epitaxy structures respectively on the first and second semiconductor fins. The first epitaxy structure is merged with the second epitaxy structure, and a bottom surface of the second epitaxy structure is lower than a bottom surface of the first epitaxy structure.

According to some embodiments, an integrated circuit device includes a semiconductor substrate; first to third semiconductor fins over the semiconductor substrate, wherein the second semiconductor fin is between the first and third semiconductor fins; first to third epitaxy structures respectively on the first to third semiconductor fins, wherein the second epitaxy structure is spaced apart from the first epitaxy structure, and the second epitaxy structure is merged with the third epitaxy structure; a first fin sidewall spacer on a sidewall of the first epitaxy structure facing the second epitaxy structure; and a second fin sidewall spacer on a first sidewall of the second epitaxy structure facing the first epitaxy structure, wherein a sidewall of the third epitaxy structure facing the second epitaxy structure has a portion at a same level as the second fin sidewall spacer, and the portion of the sidewall of the third epitaxy structure is free of a fin sidewall spacer.

According to some embodiments, an integrated circuit device includes a semiconductor substrate; first and second semiconductor fins over the semiconductor substrate; first and second epitaxy structures respectively on the first and second semiconductor fins, wherein the second epitaxy structure is spaced apart from the first epitaxy structure; and a first fin sidewall spacer on a first sidewall of the first epitaxy structure facing the second epitaxy structure, wherein a second sidewall of the first epitaxy structure opposite the first sidewall is free of a fin sidewall spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
   a semiconductor substrate;
   first and second semiconductor fins over the semiconductor substrate; and
   first and second epitaxy structures respectively on the first and second semiconductor fins, wherein the first epitaxy structure is merged with the second epitaxy structure, and a bottom surface of the second epitaxy structure is lower than a bottom surface of the first epitaxy structure.

2. The integrated circuit device of claim 1, further comprising:
   a first fin sidewall spacer on a sidewall of the first epitaxy structure facing the second epitaxy structure, wherein a sidewall of the second epitaxy structure facing the first epitaxy structure is free of a fin sidewall spacer.

3. The integrated circuit device of claim 1, further comprising:
   a first fin sidewall spacer on a sidewall of the first epitaxy structure facing the second epitaxy structure; and
   a second fin sidewall spacer on a sidewall of the second epitaxy structure facing the first epitaxy structure, wherein a top of the second fin sidewall spacer is lower than a top of the first fin sidewall spacer.

4. The integrated circuit device of claim 1, further comprising:
   a third semiconductor fin over the semiconductor substrate, wherein the first semiconductor fin is between the second and third semiconductor fins; and
   a third epitaxy structure on the third semiconductor fin, wherein the third epitaxy structure is spaced apart from the first and second epitaxy structures.

5. The integrated circuit device of claim 4, wherein the bottom surface of the second epitaxy structure is lower than a bottom surface of the third epitaxy structure.

6. The integrated circuit device of claim 4, further comprising:
   a first fin sidewall spacer on a sidewall of the first epitaxy structure facing the third epitaxy structure; and
   a third fin sidewall spacer on a sidewall of the third epitaxy structure facing the first epitaxy structure, wherein a sidewall of the second epitaxy structure facing the first epitaxy structure is free of a fin sidewall spacer.

7. The integrated circuit device of claim 4, further comprising:
   a first fin sidewall spacer on a sidewall of the first epitaxy structure facing the third epitaxy structure;
   a second fin sidewall spacer on a sidewall of the second epitaxy structure facing the first epitaxy structure; and
   a third fin sidewall spacer on a sidewall of the third epitaxy structure facing the first epitaxy structure, wherein a top of the second fin sidewall spacer is lower than a top of the first fin sidewall spacer and a top of the third fin sidewall spacer.

8. The integrated circuit device of claim 4, wherein a distance between the first and second semiconductor fins is substantially equal to a distance between the first and third semiconductor fins.

9. An integrated circuit device, comprising:
   a semiconductor substrate;
   first to third semiconductor fins over the semiconductor substrate, wherein the second semiconductor fin is between the first and third semiconductor fins;
   first to third epitaxy structures respectively on the first to third semiconductor fins, wherein the second epitaxy structure is spaced apart from the first epitaxy structure, and the second epitaxy structure is merged with the third epitaxy structure;
   a first fin sidewall spacer on a sidewall of the first epitaxy structure facing the second epitaxy structure; and
   a second fin sidewall spacer on a first sidewall of the second epitaxy structure facing the first epitaxy structure, wherein a sidewall of the third epitaxy structure facing the second epitaxy structure has a portion at a same level as the second fin sidewall spacer, and the portion of the sidewall of the third epitaxy structure is free of a fin sidewall spacer.

10. The integrated circuit device of claim 9, wherein the first sidewall of the second epitaxy structure is more vertical than the sidewall of the third epitaxy structure.

11. The integrated circuit device of claim 9, wherein a second sidewall of the second epitaxy structure facing the third epitaxy structure has a portion at a same level as the second fin sidewall spacer, and the portion of the second sidewall of the second epitaxy structure is free of a fin sidewall spacer.

12. The integrated circuit device of claim 9, further comprising:
    a third fin sidewall spacer on a sidewall of the third epitaxy structure, wherein the third epitaxy structure extends beyond the third fin sidewall spacer.

13. The integrated circuit device of claim 9, wherein the second epitaxy structure does not extend beyond the second fin sidewall spacer.

14. The integrated circuit device of claim 9, wherein the first epitaxy structure does not extend beyond the first fin sidewall spacer.

15. An integrated circuit device, comprising:
    a semiconductor substrate;
    first and second semiconductor fins over the semiconductor substrate;
    first and second epitaxy structures respectively on the first and second semiconductor fins, wherein the second epitaxy structure is spaced apart from the first epitaxy structure; and
    a first fin sidewall spacer on a first sidewall of the first epitaxy structure facing the second epitaxy structure, wherein a second sidewall of the first epitaxy structure opposite the first sidewall of the first epitaxy structure is free of a fin sidewall spacer.

16. The integrated circuit device of claim 15, further comprising:
    a second fin sidewall spacer on a first sidewall of the second epitaxy structure facing the first epitaxy structure, wherein a second sidewall of the second epitaxy structure opposite the first sidewall of the second epitaxy structure is free of a fin sidewall spacer.

17. The integrated circuit device of claim 15, wherein the first sidewall of the first epitaxy structure is more vertical than the second sidewall of the first epitaxy structure.

18. The integrated circuit device of claim 15, wherein the first epitaxy structure does not extend beyond the first fin sidewall spacer.

19. The integrated circuit device of claim 15, wherein the second sidewall of the first epitaxy structure is an angled sidewall.

20. The integrated circuit device of claim 15, further comprising:
    a first contact over the first epitaxy structure; and
    a second contact over the second epitaxy structure.

* * * * *